United States Patent
Yang et al.

(10) Patent No.: US 11,244,898 B2
(45) Date of Patent: Feb. 8, 2022

(54) INTEGRATED CIRCUIT INTERCONNECT STRUCTURES WITH AIR GAPS

(71) Applicant: Taiwan Semiconductor Manufacturing Co., Ltd., Hsin-Chu (TW)

(72) Inventors: Tai-I Yang, Hsinchu (TW); Li-Lin Su, Taichung County (TW); Yung-Hsu Wu, Taipei (TW); Hsin-Ping Chen, Hsinchu County (TW); Cheng-Chi Chuang, New Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/380,386

(22) Filed: Apr. 10, 2019

(65) Prior Publication Data
US 2020/0006228 A1   Jan. 2, 2020

Related U.S. Application Data

(60) Provisional application No. 62/691,809, filed on Jun. 29, 2018.

(51) Int. Cl.
| | | |
|---|---|---|
| H01L 23/528 | (2006.01) | |
| H01L 21/768 | (2006.01) | |
| H01L 23/522 | (2006.01) | |
| H01L 21/8234 | (2006.01) | |

(52) U.S. Cl.
CPC ...... *H01L 23/5283* (2013.01); *H01L 21/7682* (2013.01); *H01L 21/76832* (2013.01); *H01L 21/76834* (2013.01); *H01L 21/76898* (2013.01); *H01L 21/823431* (2013.01); *H01L 21/823475* (2013.01); *H01L 21/823481* (2013.01); *H01L 23/5226* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,054,164 B1 * | 6/2015 | Jezewski .......... H01L 21/76879 |
| 9,105,490 B2 | 8/2015 | Wang et al. |

(Continued)

*Primary Examiner* — Khaja Ahmad
(74) *Attorney, Agent, or Firm* — Haynes and Boone, LLP

(57) ABSTRACT

Examples of an integrated circuit with an interconnect structure and a method for forming the integrated circuit are provided herein. In some examples, the method includes receiving a workpiece having an interconnect structure that includes a first conductive feature, a second conductive feature disposed beside the first conductive feature, and an inter-level dielectric disposed between the first conductive feature and the second conductive feature. A conductive material of an etch stop layer is selectively deposited on the first conductive feature and on the second conductive feature without depositing the conductive material on the inter-level dielectric, and the inter-level dielectric is removed to form a gap between the first conductive feature and the second conductive feature.

20 Claims, 18 Drawing Sheets

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2010/0133648 A1* | 6/2010 | Seidel | H01L 23/53238 |
| | | | 257/522 |
| 2012/0244698 A1* | 9/2012 | Ryan | H01L 21/76834 |
| | | | 438/653 |
| 2015/0097293 A1* | 4/2015 | Yao | H01L 21/76832 |
| | | | 257/773 |
| 2016/0204002 A1* | 7/2016 | Wallace | H01L 21/4846 |
| | | | 257/773 |
| 2017/0103949 A1* | 4/2017 | Teng | H01L 21/31 |
| 2018/0261546 A1* | 9/2018 | Bark | H01L 21/76802 |

\* cited by examiner

INTEGRATED CIRCUIT INTERCONNECT STRUCTURES WITH AIR GAPS

PRIORITY DATA

The present application claims the benefit of U.S. Provisional Application No. 62/691,809, entitled "Inter-Metal Structure and Methods of Forming the Same," filed Jun. 29, 2018, which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

Advances have been made to device fabrication as well as to the fabrication of the network of conductors that couple them. In that regard, an integrated circuit may include an interconnect structure to electrically couple the circuit devices (e.g., Fin-like Field Effect Transistors (FinFETs), planar FETs, memory devices, Bipolar-Junction Transistors (BJTs), Light-Emitting Diodes (LEDs), other active and/or passive devices, etc.). The interconnect structure may include any number of dielectric layers stacked vertically with conductive lines running horizontally within the layers. Vias may extend vertically to connect conductive lines in one layer with conductive lines in an adjacent layer. Similarly, contacts may extend vertically between the conductive lines and substrate-level features. Together, the lines, vias, and contacts carry signals, power, and ground between the devices and allow them to operate as a circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
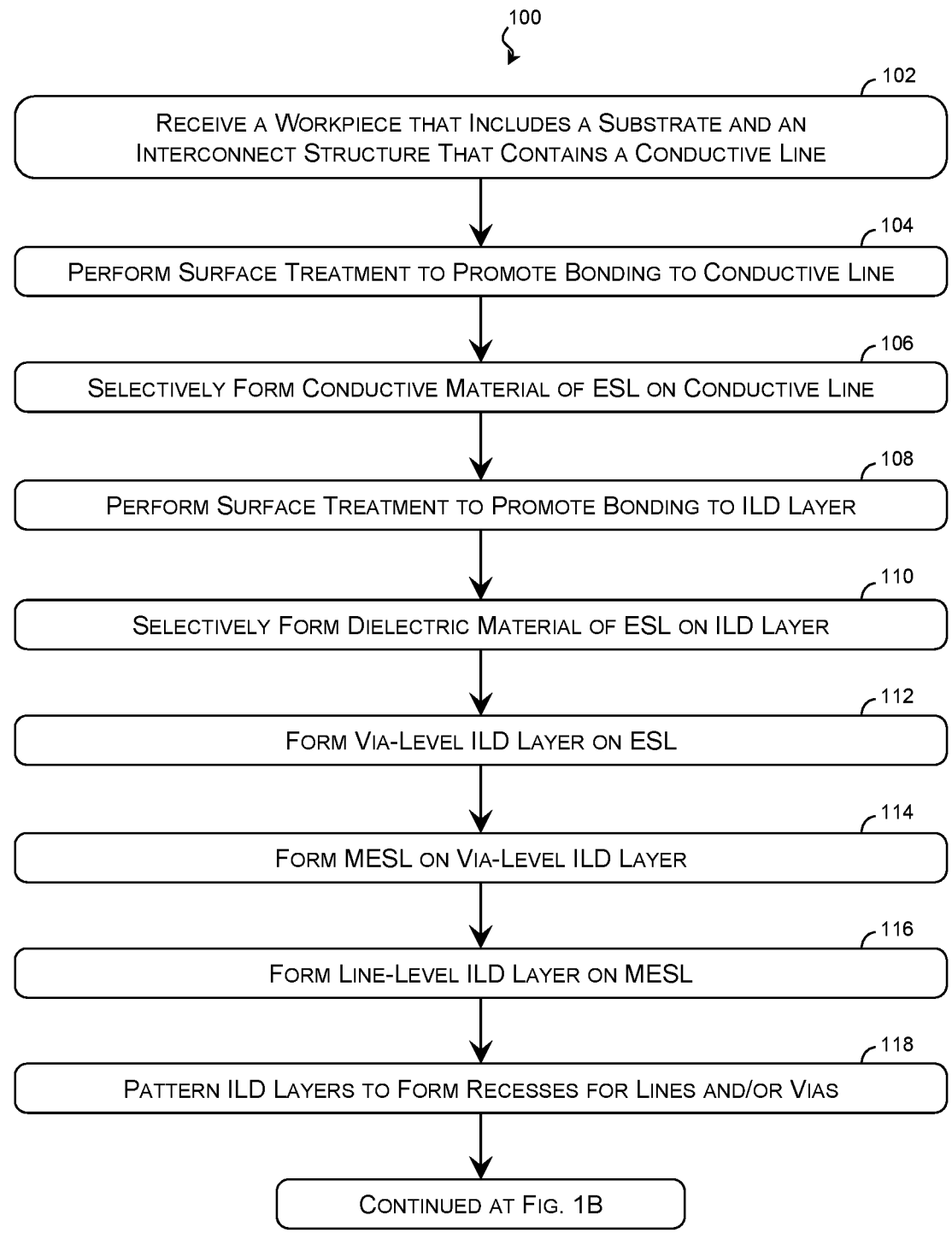
FIGS. 1A and 1B are flow diagrams of a method of fabricating a workpiece with an interconnect structure according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Integrated circuits include an ever-increasing number of active and passive circuit devices formed on a substrate or wafer with a complex interconnect structure disposed on top to electrically couple the devices. However, as conductive features in the interconnect become smaller and closer together, the interconnect may become increasingly difficult to fabricate, and adverse effects from neighboring conductors may become pronounced. For example, as the spacing between conductive lines is reduced, interference, noise, and parasitic coupling capacitance may all increase.

Using an interconnect dielectric with a low permittivity (relative to silicon dioxide) may reduce these effects. Some examples of the present disclosure further reduce the permittivity of the interconnect by forming air gaps, which further improve the insulating quality. For example, the air gaps may reduce parasitic coupling capacitance and thereby reduce the energy required to drive a signal through a conductive line. This may allow the use of lower powered circuit devices. The air gaps may also reduce noise caused by adjacent conductive lines, which may otherwise cause signal errors. In these examples and others, the present technique may reduce errors, allow for closer conductor spacing, reduce circuit power, and reduce overall circuit size.

As the conductive lines may be a larger contributor to interconnect capacitance than the vias, the air gaps may be formed between the conductive lines without being formed between the vias. By not forming air gaps between the vias, the technique may avoid compromising the vias and may avoid via-bridging, time dependent dielectric breakdown, and other via defects. Some examples of the present disclosure further improve fabrication by using selective deposition to selectively deposit an etch stop layer such that a conductive material of the etch stop layer is disposed over the conductive lines and a dielectric material of the etch stop layer is disposed over the interconnect dielectric. By forming an etch stop layer with a conductive material that the vias can couple through, the technique may avoid an etch stop layer opening step and improve via overlay error tolerance. In these ways and others, the technique allows smaller interconnect features to be formed with more reliably and regularity. It is noted, however, that these advantages are merely examples, and no particular advantage is required for any particular embodiment.

Figure 1B:
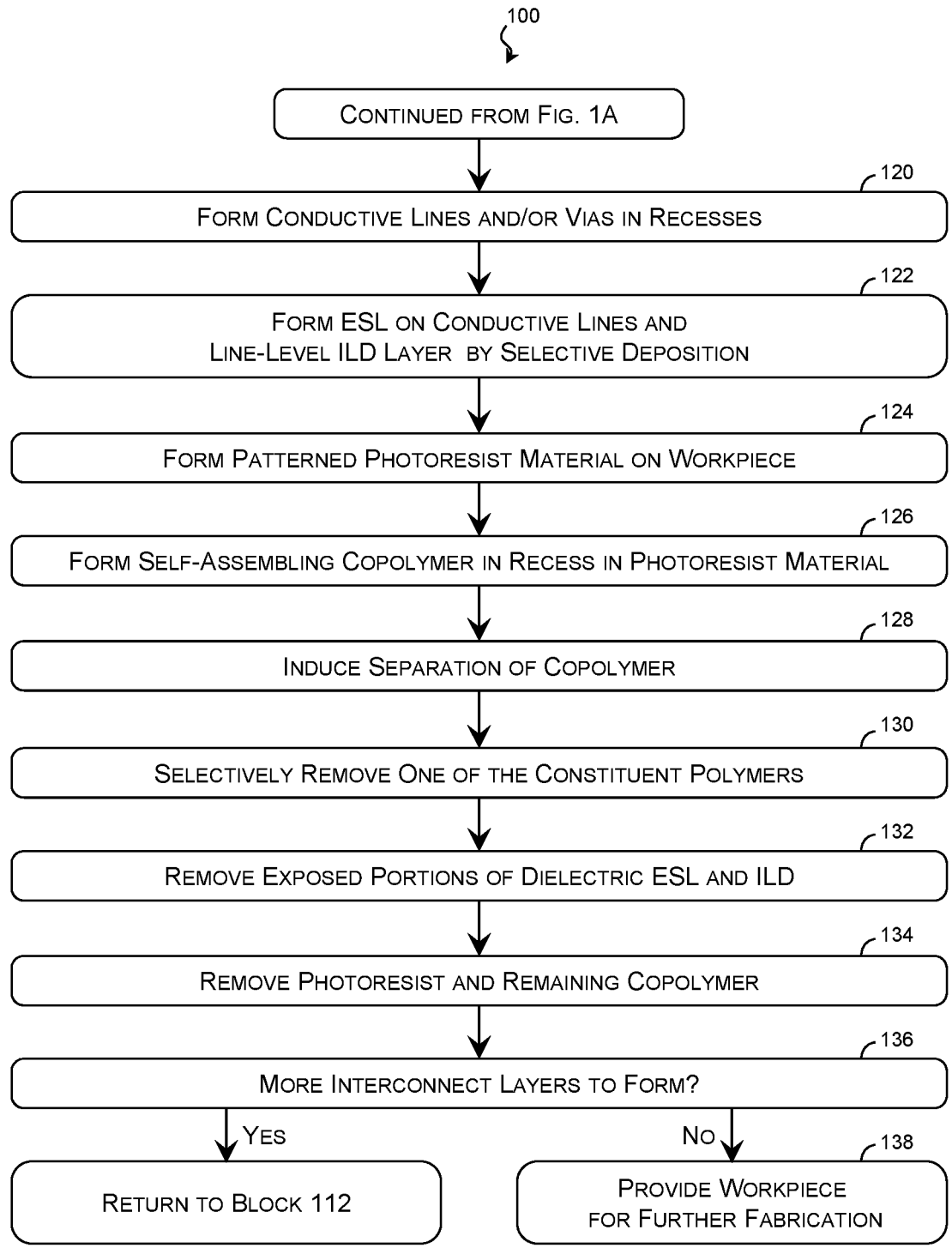

The present disclosure provides examples of an integrated circuit interconnect structure with air gaps. Examples of the interconnect structure and a technique for forming the circuit and interconnect structure are described with reference to FIGS. 1A-19. In that regard, FIGS. 1A and 1B are flow diagrams of a method 100 of fabricating a workpiece 200 with an interconnect structure according to various aspects of the present disclosure. Additional steps can be provided before, during, and after the method 100, and some of the steps described can be replaced or eliminated for other embodiments of the method 100. FIGS. 2A and 13-18 are perspective illustrations of the workpiece 200 undergoing the method 100 of fabrication according to various aspects of the present disclosure. FIGS. 2B, 3-12, and 19 are cross-sectional illustrations of the workpiece 200 undergoing the method 100 of fabrication according to various aspects of the present disclosure.

Figure 2A:
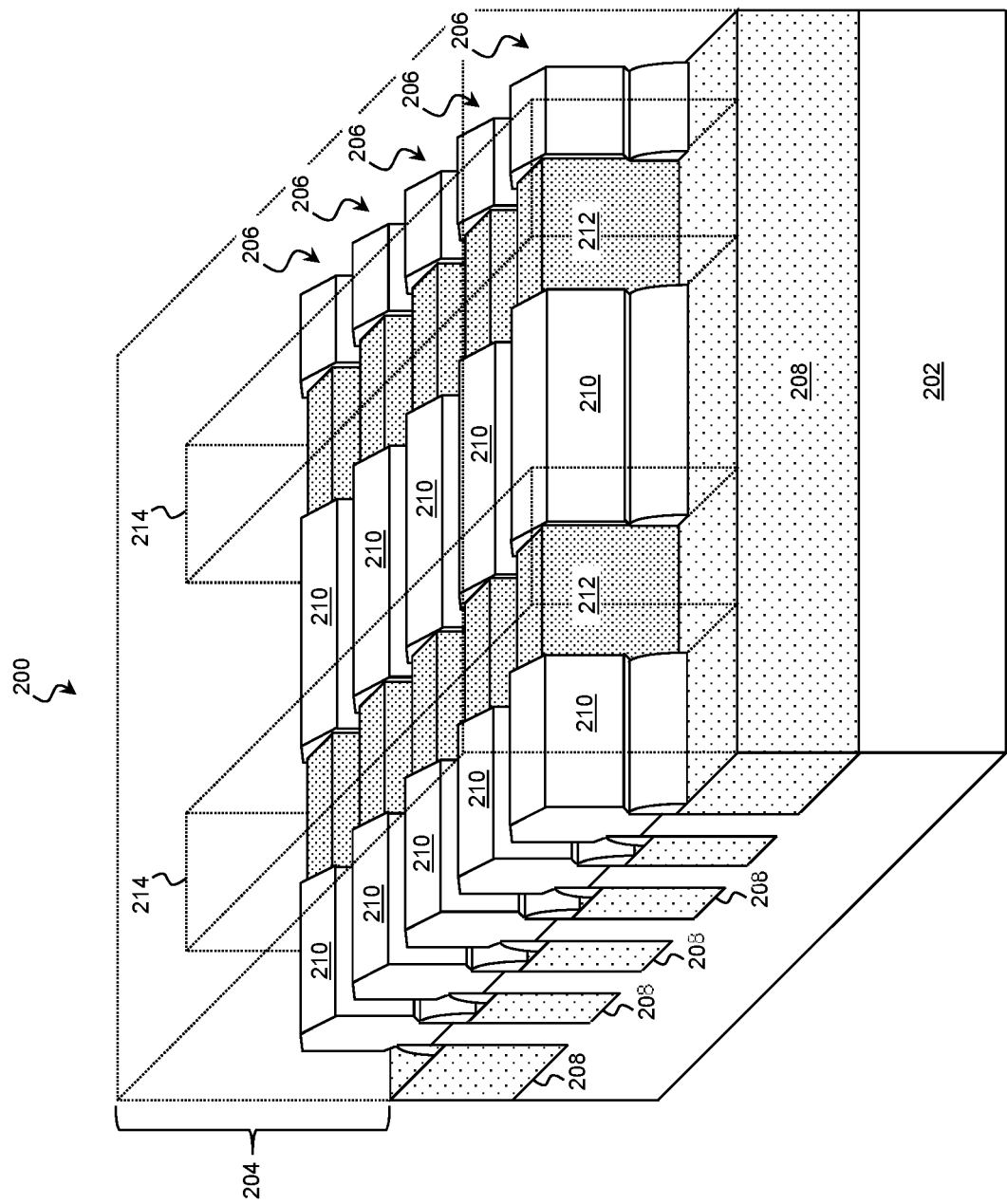
FIG. 2A is a perspective illustration of the workpiece undergoing the method of fabrication according to various aspects of the present disclosure.
Figure 2B:
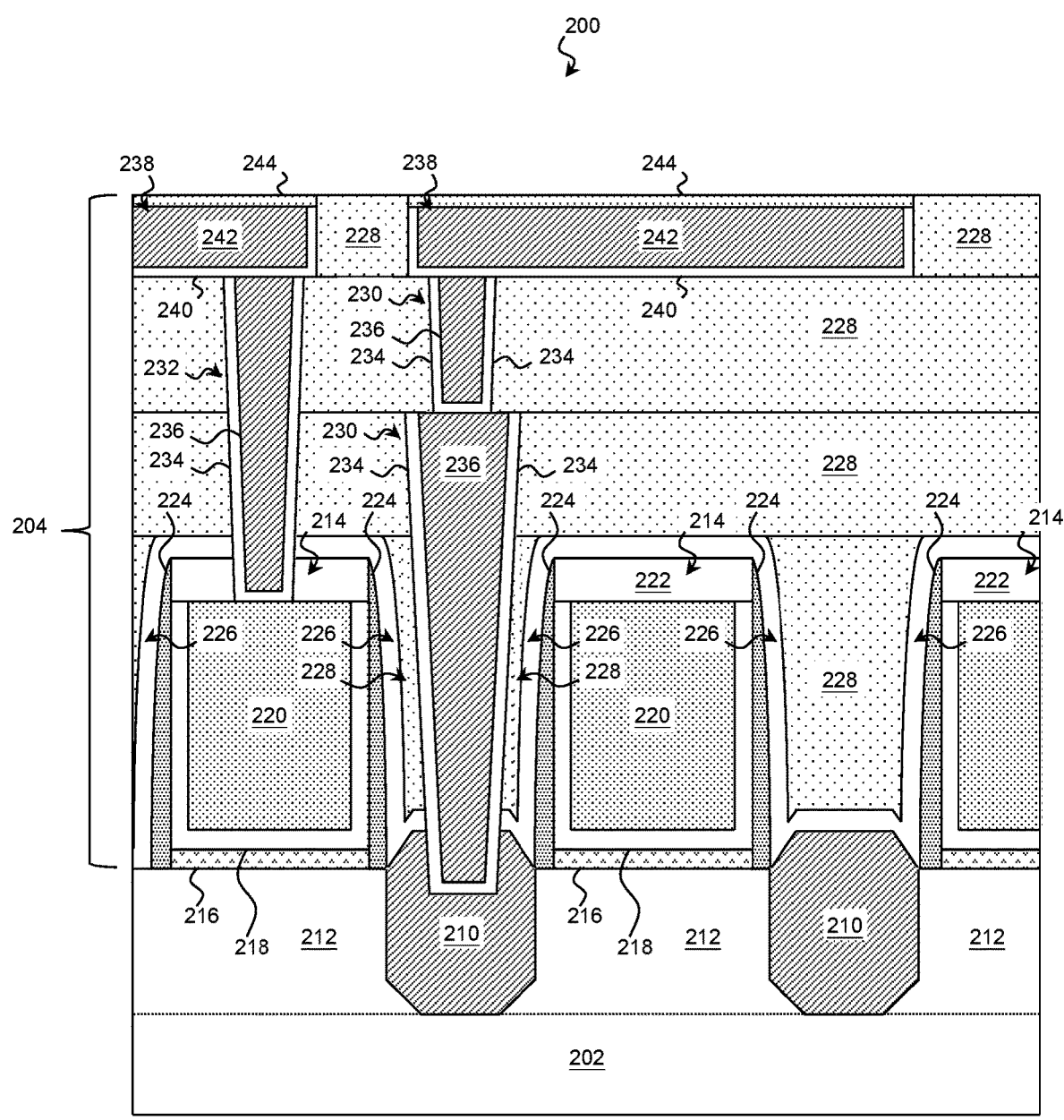
FIGS. 2B and 3-12 are cross-sectional illustrations of the workpiece undergoing the method of fabrication according to various aspects of the present disclosure.

Referring to block 102 of FIG. 1A and to FIGS. 2A and 2B, a workpiece 200 is received that includes a substrate 202 and a portion of an interconnect structure 204 disposed over the substrate 202. The interconnect structure 204 is represented by a transparent marker in FIG. 2A to avoid obscuring the underlying structures of the substrate 202. The substrate 202 represents any structure upon which circuit devices may be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form fins. The layers may have similar or different compositions, and in various embodiments, some substrate layers have non-uniform compositions to induce device strain and thereby tune device performance. Examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, other suitable insulator materials, and/or combinations thereof.

Doped regions, such as wells, may be formed on the substrate 202. In that regard, some portions of the substrate 202 may be doped with p-type dopants, such as boron, $BF_2$, or indium while other portions of the substrate 202 may be doped with n-type dopants, such as phosphorus or arsenic; and/or other suitable dopants including combinations thereof.

A number of circuit devices may be formed on the substrate 202 such as Fin-like Field Effect Transistors (FinFETs), planar FETs, memory devices, Bipolar-Junction Transistors (BJTs), Light-Emitting Diodes (LEDs), other active and/or passive devices. In some examples, the devices to be formed on the substrate 202 extend out of the substrate 202. For example, FinFETs and/or other non-planar devices may be formed on device fins 206 disposed on the substrate 202. The device fins 206 are representative of any raised feature and include FinFET device fins 206 as well as fins 206 for forming other raised active and passive devices upon the substrate 202. The fins 206 may be similar in composition to the substrate 202 or may be different therefrom. For example, in some embodiments, the substrate 202 may include primarily silicon, while the fins 206 include one or more layers that are primarily germanium or a SiGe semiconductor. In some embodiments, the substrate 202 includes a SiGe semiconductor, and the fins 206 include a SiGe semiconductor with a different ratio of silicon to germanium than the substrate 202.

The fins 206 may be formed by etching portions of the substrate 202, by depositing various layers on the substrate 202 and etching the layers, and/or by other suitable techniques. For example, the fins 206 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 206 and is patterned using a photolithography process. Spacers are formed alongside the patterned sacrificial layer using a self-aligned process. The sacrificial layer is then removed, and the remaining spacers are used to pattern the fins 206 by removing material of the substrate 202 that is not covered by the spacers so that the fins 206 remain.

The workpiece 200 may also include an isolation dielectric layer 208 disposed on the substrate 202 between the fins 206 to form isolation features (e.g., Shallow Trench Isolation features (STIs)). The isolation dielectric layer 208 may include a dielectric material such as a semiconductor oxide, a semiconductor nitride, a semiconductor oxynitride, a semiconductor carbide, a semiconductor carbonitride, a semiconductor oxycarbonitride, a metal oxide, etc. The isolation dielectric layer 208 may be formed by any suitable process, and in some examples, the isolation dielectric layer 208 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. Following deposition, the isolation dielectric layer 208 may be etched back so that the uppermost portions of the fins 206 protrude above the isolation dielectric layer 208. In various such examples, the fins 206 extend between about 100 nm and about 500 nm above the topmost surface of the isolation dielectric layer 208.

The fins 206 may include source/drain features 210 and channel regions 212 disposed between the source/drain features. The source/drain features 210 and the channel regions 212 may be doped to be of opposite type. For an n-channel device, the source/drain features 210 are doped with an n-type dopant and the channel region 212 is doped with a p-type dopant, and vice versa for an p-channel device.

One or more gate structures 214 may be disposed above and alongside the channel regions 212. The flow of carriers (electrons for an n-channel device and holes for a p-channel device) through the channel region between the source/drain features 210 is controlled by a voltage applied to the gate structures 214. To avoid obscuring other features of the workpiece 200, the gate structures 214 are represented by translucent markers in FIG. 2A.

Suitable gate structures 214 include both polysilicon and metal gates. An exemplary gate structure 214 includes an interfacial layer 216 disposed on the channel region 212 that contains an interfacial material, such as a semiconductor oxide, semiconductor nitride, semiconductor oxynitride, other semiconductor dielectric, other suitable interfacial materials, and/or combinations thereof. A gate dielectric 218 is disposed on the interfacial layer 216 and includes one or more dielectric materials such as a high-k dielectric material (e.g., $HfO_2$, HfSiO, HfSiON, HfTaO, HfTiO, HfZrO, zirconium oxide, aluminum oxide, hafnium dioxide-alumina ($HfO_2$—$Al_2O_3$) alloy, etc.), semiconductor oxide, semiconductor nitride, semiconductor oxynitride, semiconductor carbide, amorphous carbon, tetraethylorthosilicate (TEOS), other suitable dielectric material, and/or combinations thereof.

A gate electrode 220 is disposed on the gate dielectric 218 and includes layers of conductive materials. An exemplary gate electrode 220 includes a capping layer, one or more work function layers disposed on the capping layer, and an electrode fill disposed on the work function layer(s).

In some examples, the gate structure 214 includes a gate cap 222 on top of the gate dielectric 218 and the gate electrode 220. The gate cap 222 may include a dielectric material (e.g., a semiconductor oxide, a semiconductor nitride, a semiconductor oxynitride, a semiconductor carbide, a semiconductor oxycarbonitride, etc.), polysilicon, Spin-On Glass (SOG), TEOS, Plasma Enhanced CVD oxide (PE-oxide), High-Aspect-Ratio-Process (HARP)-formed oxide, and/or other suitable material.

Sidewall spacers 224 are disposed on the side surfaces of the gate structures 214 and are used to offset the source/drain features 210 and to control the source/drain junction profile. In various examples, the sidewall spacers 224 include one or more layers of dielectric materials, such as a semiconductor oxide, a semiconductor nitride, a semiconductor oxynitride, a semiconductor carbide, a semiconductor oxycarbonitride, SOG, TEOS, PE-oxide, HARP-formed oxide, and/or other suitable materials.

The workpiece 200 may also include a Bottom Contact Etch-Stop Layer (BCESL) 226 disposed on the source/drain features 210, on the gate structures 214, and alongside the sidewall spacers 224. The BCESL 226 may include a dielectric (e.g., a semiconductor oxide, a semiconductor nitride, a semiconductor oxynitride, a semiconductor carbide, etc.) and/or other suitable material. In various embodiments, the BCESL 226 includes SiN, SiO, SiON, and/or SiC.

The interconnect structure 204 electrically couples the circuit features such as the source/drain features 210 and the gate structures 214. The interconnect structure 204 includes a number of conductive features interspersed between layers of an Inter-Level Dielectric (ILD layers 228). The ILD layers 228 may include any suitable dielectric material, such as a semiconductor oxide, a semiconductor nitride, a semiconductor oxynitride, a semiconductor carbide, TEOS oxide, PhosphoSilicate Glass (PSG), BoroPhosphoSilicate Glass (BPSG), Fluorinated Silica Glass (FSG), carbon doped silicon oxide, Black Diamond®, Xerogel, Aerogel, amorphous fluorinated carbon, Parylene, BCB (bis-benzocyclobutenes), SiLK® (a registered trademark of Dow Chemical, Midland, Mich.), polyimide, other suitable materials, and/or combinations thereof. The ILD layers 228 act to support and electrically isolate the conductive features.

Capacitance occurs between parallel conductors, such as conductive lines, contacts, and/or vias, that are separated by a dielectric, such as the ILD layer 228. This capacitance may slow the transmission of signals through the interconnect 204. To address this, the interconnect's ILD layer(s) 228 may incorporate materials with low dielectric constants (e.g., low-k dielectrics, which have a lower dielectric constant than silicon dioxide). The lower dielectric constant of these materials may reduce parasitic coupling capacitance as well as interference and noise between the conductive features. To further reduce the dielectric constant of the interconnect 204, portions of the ILD layers 228 are removed to form air gaps.

The lowest ILD layers 228 of the interconnect structure 204 support and electrically isolate the gate structures 214 as well as contacts that couple to substrate features, such as source/drain contacts 230 and gate contacts 232 that extend to and electrically couple to the source/drain features 210 and gate structures 214, respectively. The contacts 230 and 232 may each include a contact liner 234 and a contact fill 236. The contact liner 234 may act as a seed layer when depositing the contact fill 236 and may promote adhesion of the contact fill 236 to the remainder of the workpiece 200. The contact liner 234 may also act a barrier that prevents material of the contact from diffusing into the workpiece 200. The contact liner 234 may include any suitable conductive material including metals (e.g., Ti, Ta, Co, W, Al, Ni, Cu, Co, etc.), metal nitrides, metal silicon nitrides, other suitable materials, and/or combinations thereof. In one such embodiment, the contact liner 234 includes TiN. The contact fill 236 may include any suitable material including metals (e.g., Co, W, Al, Ta, Ti, Ni, Cu, etc.), metal oxides, metal nitrides, other suitable materials, and/or combinations thereof, and in some examples, the contact fill 236 includes cobalt and/or tungsten.

Subsequent ILD layers 228 of the interconnect structure 204 may contain conductive lines 238 that extend horizontally in a given layer and/or vias that extend vertically to couple conductive lines 238 in different layers. The conductive lines 238 may each include a liner 240, a fill material 242, and a line cap 244 disposed on the liner 240. The liner 240 may be substantially similar to the contact liner 234 and may include one or more metals, metal nitrides, metal silicon nitrides, other suitable materials, and/or combinations thereof. In one such embodiment, the liner 240 includes TiN. The fill material 242 may be substantially similar to the contact fill 236 and may include one or more metals, metal oxides, metal nitrides, other suitable materials, and/or combinations thereof. In one such embodiment, the fill material 242 includes cobalt and/or tungsten.

The line cap 244 may include any suitable conductive material including metals, metal oxides, metal nitrides, and/or combinations thereof, and the material of the line cap 244 may be the same or different from the fill material 242 and/or the liner 240. In some examples, the line cap 244 includes a metal and a dopant that increases the etch selectivity of the line cap 244. The line cap 244 may have any suitable thickness, and in various examples, is between about 1 nm and about 5 nm thick.

The conductive lines 238 and vias that connect them may be formed layer-by-layer, and the alignment of features in the different layers (e.g., the overlay) may have a significant impact on the functionality and reliability of the finished circuit. Some examples that follow use selective deposition to self-align materials and thereby reduce the impact of overlay errors.

To form a new layer, an etch stop layer may be formed on the existing ILD layer 228 and on any conductive lines 238 therein. The etch stop layer may be different in composition than the surrounding ILD layers 228 and may have a different etch selectivity to prevent over-etching when patterning the ILD layers 228. In some examples, a uniform etch stop layer is formed over both the underlying ILD layer 228 and the conductive lines 238. Such an etch stop layer may include a semiconductor oxide, a semiconductor nitride, a semiconductor oxynitride, a semiconductor carbide, and/or other suitable dielectric material. This type of etch stop layer may be formed using any suitable process including ALD, PEALD, CVD, PECVD, HDP-CVD, and/or other suitable deposition processes, and may be formed to any suitable thickness. To form vias that couple to the conductive lines 238, the etch stop layer may be selectively removed over some portions of the conductive lines 238.

Additionally or in the alternative, an etch stop layer may include a conductive material selectively deposited on the conductive lines 238 and a dielectric material selectively deposited on the ILD layer 228. In this configuration, vias may couple to the conductive lines 238 through the conductive material of the etch stop layer, which may save an etching step and reduce some types of via overlay issues.

Figure 3:
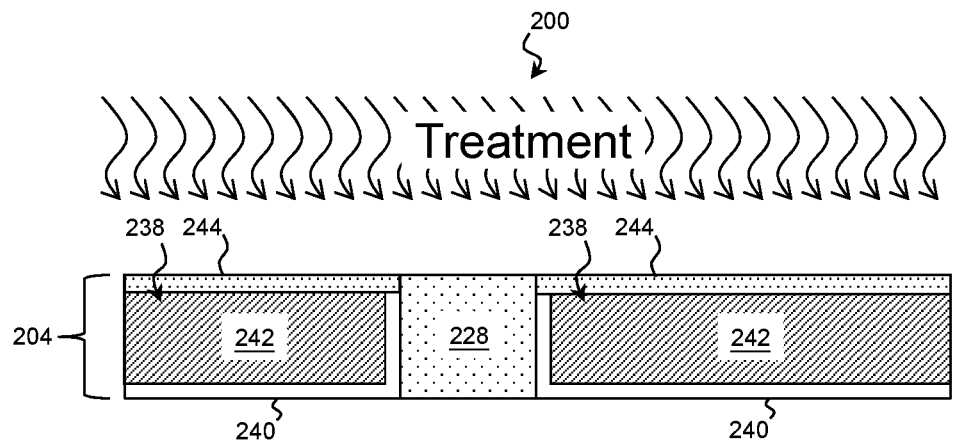

To form an etch stop layer that includes a conductive material, a surface treatment is performed on the workpiece 200 as shown in block 104 of FIG. 1A and FIG. 3. The surface treatment may be configured to promote bonding between a material of the existing conductive line 238 (e.g., the line cap 244) and a material of an etch stop line cap. The surface treatment may alter any suitable property of the existing conductive line 238 to promote this bonding, and in some examples, the surface treatment increases or decreases the hydrophilicity of the top surface of the line cap 244 to more closely match the hydrophilicity of the etch stop line cap to be formed later. This may include increasing or decreasing the polarity of the top surface of the line cap 244. In various examples, the surface treatment uses plasma and/or a wet reagent to adjust the properties of the line cap 244 and thereby promote bonding. Furthermore, the treatment may be configured to inhibit or at least not promote bonding between the etch stop line cap and other components of the workpiece 200 (e.g., the existing ILD layer 228). Thus, the treatment may make the subsequent deposition more material-selective.

Figure 4:
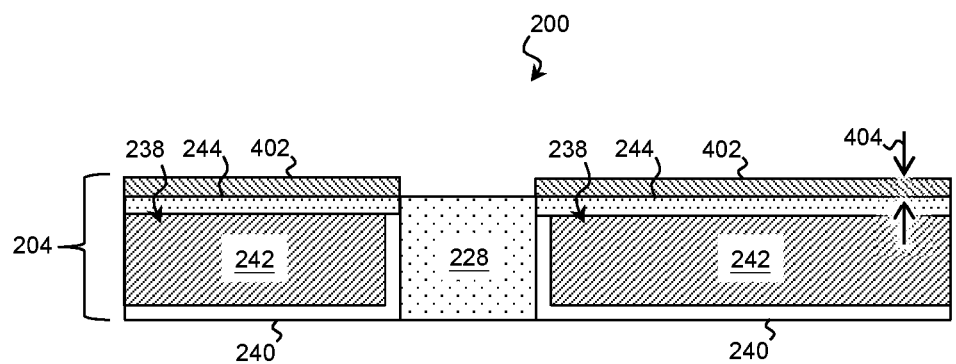
Figure 5:
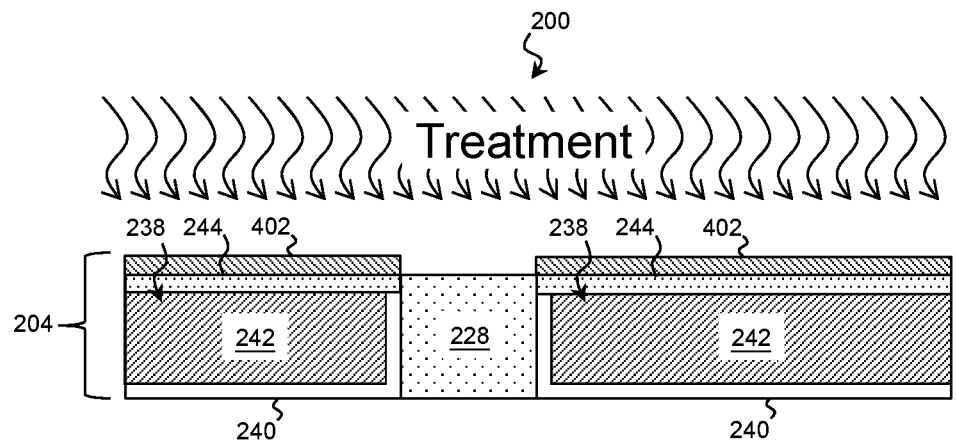

Referring to block 106 of FIG. 1A and to FIG. 4, the etch stop line cap 402 is selectively formed on the conductive lines 238 (e.g., on the line cap 244 of the underlying conductive lines 238), without being formed on other materials of the workpiece 200, such as the ILD layer 228. In particular, the etch stop line cap 402 is configured to bond to selected materials of the workpiece 200 without bonding to others. The surface treatment of block 104 may promote this selective bonding of the etch stop line cap 402. The etch stop line cap 402 may be applied by any suitable process including spin coating, dip coating, vapor deposition, CVD, PECVD, HDP-CVD, ALD, PEALD, and/or other suitable techniques. The etch stop line cap 402 may be formed to any suitable thickness 404, and in various examples, the thickness 404 ranges from about 10 Å to about 50 Å.

The etch stop line cap 402 may include any suitable conductive material, such as metals, metal oxides, metal nitrides, other suitable materials, and/or combinations thereof, and in some examples, the etch stop line cap 402 includes an oxide of aluminum ($Al_xO_y$) and/or an oxide of zirconium ($Zr_xO_y$). Where the etch stop line cap 402 includes a metal oxide, the metal oxide may be deposited in a single step, or the metal component may be deposited and then oxidized using a suitable process (e.g., thermal oxidation using an oxygen source such as $H_2O$, $O_2$, $O_3$, etc.).

A dielectric etch stop material may be selectively deposited on remainder of the workpiece (e.g., on the ILD layer 228). Referring to block 108 of FIG. 1A and to FIG. 5, a surface treatment is performed on the workpiece 200 that is configured to promote bonding between the ILD layer 228 and the dielectric etch stop material. The surface treatment may alter any suitable property of the ILD layer 228 to promote this bonding, and in some examples, the surface treatment increases or decreases the hydrophilicity of the top surface of the ILD layer 228 to more closely match the hydrophilicity of the dielectric etch stop material. In various examples, the surface treatment uses plasma and/or a wet reagent to adjust the properties of the ILD layer 228 and thereby promote bonding. Furthermore, the treatment may be configured to inhibit or at least not promote bonding between the dielectric etch stop material and other components of the workpiece 200 (e.g., the etch stop line cap 402).

Figure 6:
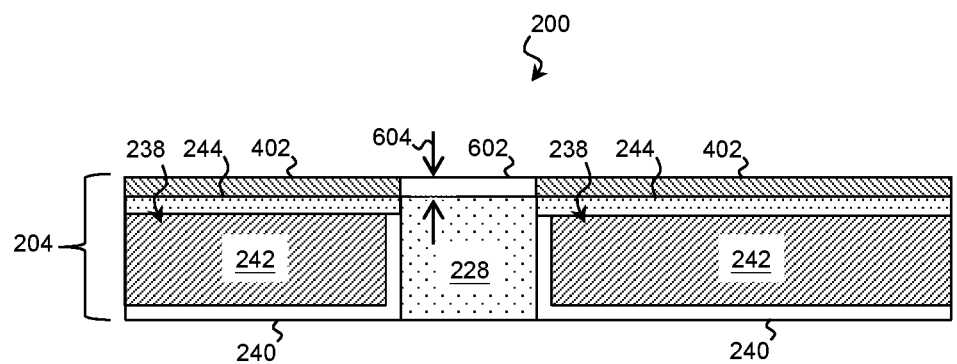

Referring to block 110 of FIG. 1A and to FIG. 6, the dielectric etch stop material 602 is formed on the ILD layer 228. In some examples, the dielectric etch stop material 602 is selectively formed on the ILD layer 228 without being formed on other materials of the workpiece 200, such as the etch stop line cap 402. In some examples, the dielectric etch stop material is formed on both the ILD layer 228 and the etch stop line cap 402, and any portion of the dielectric etch stop material 602 deposited on the etch stop line cap 402 is removed by CMP or other suitable process. The dielectric etch stop material 602 may be applied by spin coating, dip coating, vapor deposition, CVD, PECVD, HDP-CVD, ALD, PEALD, and/or other suitable techniques. The dielectric etch stop material 602 may be formed to any suitable thickness 604, and in various examples, the thickness 604 ranges from about 10 Å to about 50 Å.

The dielectric etch stop material 602 may include any suitable dielectric material, such as a semiconductor oxide, a semiconductor nitride, a semiconductor oxynitride, a semiconductor carbide, a semiconductor carbonitride, a semiconductor oxycarbonitride, a metal oxide, a metal nitride, and/or combinations thereof, and in some examples, the dielectric etch stop material 602 includes silicon oxide, silicon nitride, and/or a dielectric oxide of aluminum ($Al_xO_y$).

A CMP process may be performed after the dielectric etch stop material 602 is deposited. As discussed above, the CMP process may remove any portion of the dielectric etch stop material 602 deposited on the etch stop line cap 402 and may planarize the workpiece 200 such that the tops of the dielectric etch stop material 602 and the etch stop line cap 402 are at substantially the same height.

Figure 7:
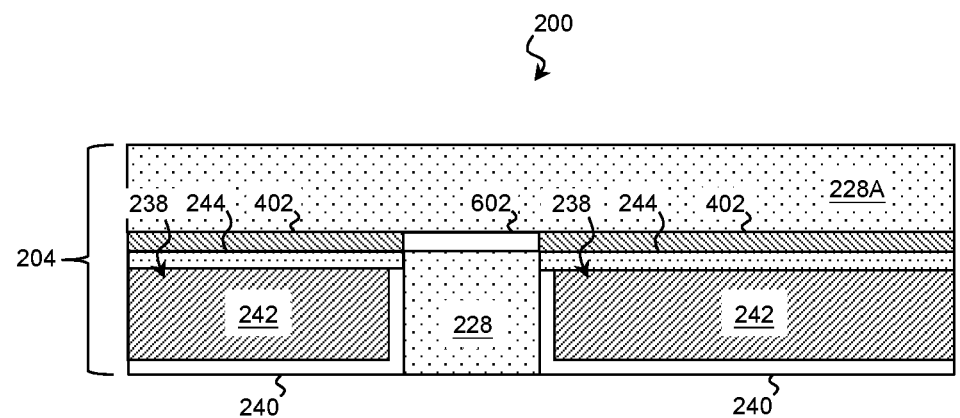

Referring to block 112 of FIG. 1A and referring to FIG. 7, a via-level ILD layer 228A is formed on the etch stop layer (e.g., etch stop line cap 402 and dielectric etch stop material 602). The via-level ILD layer 228A may be substantially similar in composition to the existing ILD layers 228 and may include a semiconductor oxide, a semiconductor nitride, a semiconductor oxynitride, a semiconductor carbide, TEOS oxide, PSG, BPSG, FSG, carbon doped silicon oxide, Black Diamond®, Xerogel, Aerogel, amorphous fluorinated carbon, Parylene, BCB, SiLK®, polyimide, other suitable dielectric materials, and/or combinations thereof. In some examples, the via-level ILD layer 228A includes a low-k dielectric material (e.g., SiCOH). The via-level ILD layer 228A may be formed using any suitable process including CVD, PECVD, HDP-CVD, ALD, PEALD, spin-on deposition, and/or other suitable deposition processes, and may be formed to any suitable thickness.

Vias may be formed within the via-level ILD layer 228A using single damascene or dual damascene metallization. The present technique is equally suitable for either type of metallization.

Figure 8:
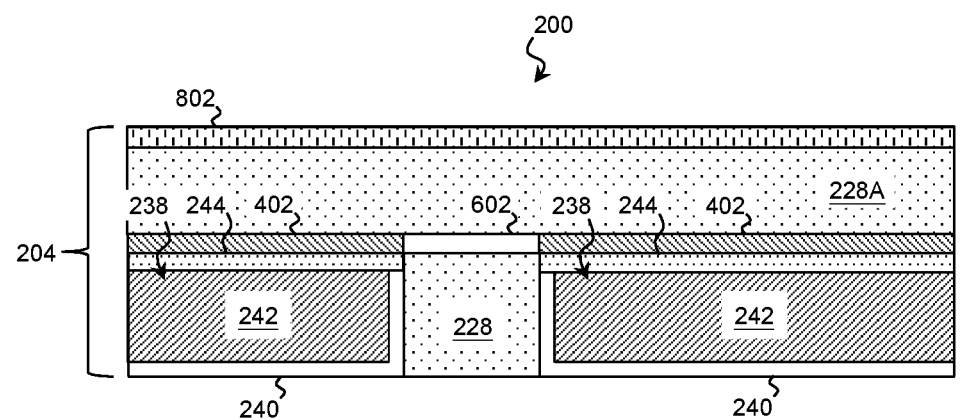

In an example of dual damascene metallization, referring to block 114 of FIG. 1A and to FIG. 8, a Mid-level Etch Stop Layer (MESL) 802 is formed on the via-level ILD layer 228A. The MESL 802 may include a semiconductor oxide, a semiconductor nitride, a semiconductor oxynitride, a semiconductor carbide, and/or other suitable dielectric material. The MESL 802 may be different in composition from the surrounding materials (e.g., the via-level ILD layer 228A) and may have a different etch selectivity to avoid over-etching when forming recesses in the surrounding materials. In various such examples, the MESL 802 includes SiN, SiCN, and/or SiC. The MESL 802 may be formed using any suitable process including ALD, PEALD, CVD, PECVD, HDP-CVD, and/or other suitable deposition processes, and may be formed to any suitable thickness. For example, the MESL 802 may have a thickness between about 1 nm and 5 nm.

Figure 9:
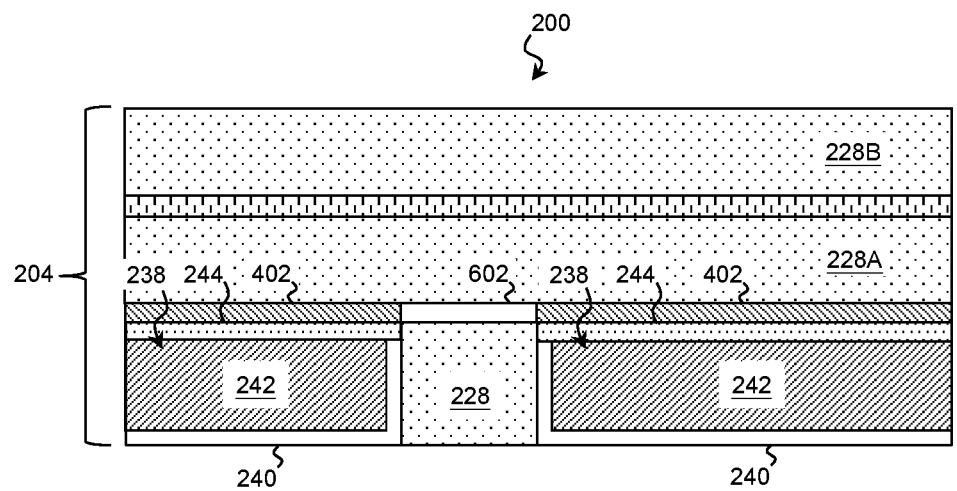

Referring to block 116 of FIG. 1A and to FIG. 9, a line-level ILD layer 228B is formed on the MESL 802. This may be performed substantially as described in block 112, and the line-level ILD layer 228B may be substantially similar to the via-level ILD layer 228A.

Figure 10:
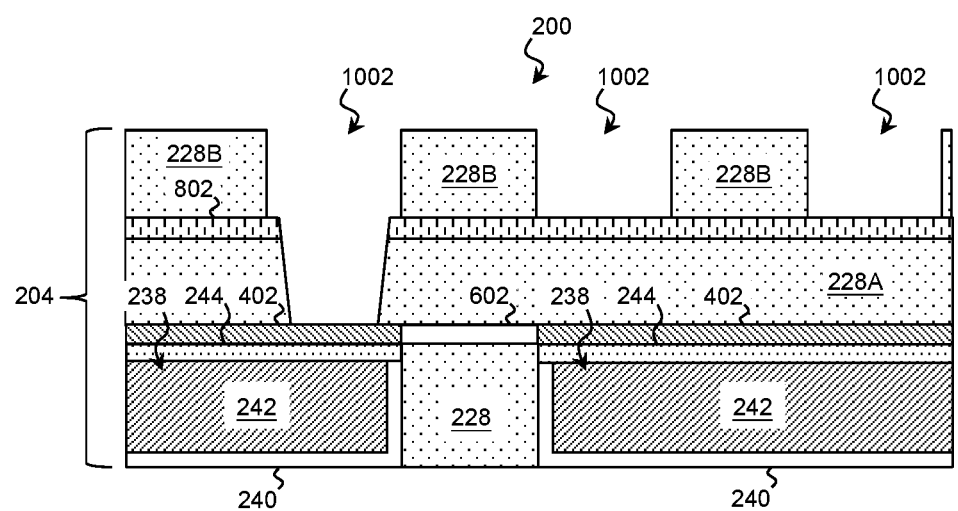

Referring to block 118 of FIG. 1A and to FIG. 10, recesses 1002 are formed in the via-level ILD layer 228A, the line-level ILD layer 228B, and the MESL 802 for conductive lines and vias. In a dual damascene process, a set of recesses 1002 may be formed (using one or more etching processes) for both vias and conductive lines, and the conductive material for both types of features are deposited in the same process.

In an example, a first photoresist is formed on the line-level ILD layer 228B and patterned in a photolithographic process to selectively expose portions of the line-level ILD layer 228B to etch to define the vias. A photolithographic system exposes the photoresist to radiation in a particular pattern determined by a mask. Light passing through or reflecting off the mask strikes the photoresist thereby transferring a pattern formed on the mask to the photoresist. Additionally or in the alternative, the photoresist may be exposed using a direct write or maskless lithographic technique, such as laser patterning, e-beam patterning, and/or ion-beam patterning. Once exposed, the photoresist is developed, leaving the exposed portions of the resist, or in alternative examples, leaving the unexposed portions of the resist. An exemplary patterning process includes soft baking of the photoresist, mask aligning, exposure, post-exposure baking, developing the photoresist, rinsing, and drying (e.g., hard baking).

The portions of the line-level ILD layer 228B exposed by the photoresist and portions of the MESL 802 directly underneath are then etched using any suitable etching technique such as wet etching, dry etching, RIE, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. The etching technique and etchants may be varied to selectively etch the different materials of the line-level ILD layer 228B and of the MESL 802.

The via etching process may also etch the underlying portions of the via-level ILD layer 228A or these portions of the via-level ILD layer 228A may be etched during a subsequent line etch. After the via etching process, any remaining photoresist may be removed.

A second photoresist is then formed on the workpiece 200 and patterned in a photolithographic process to selectively expose portions of the line-level ILD layer 228B to etch to define the conductive lines. The portions of the line-level ILD layer 228B exposed by the photoresist are etched using any suitable etching technique such as wet etching, dry etching, RIE, and/or other etching methods. After etching, any remaining photoresist may be removed. The two iterations of photolithographic patterning and etching form the recesses 1002 shown in FIG. 10, although any other suitable technique for forming the recesses 1002 may be used.

Figure 11:
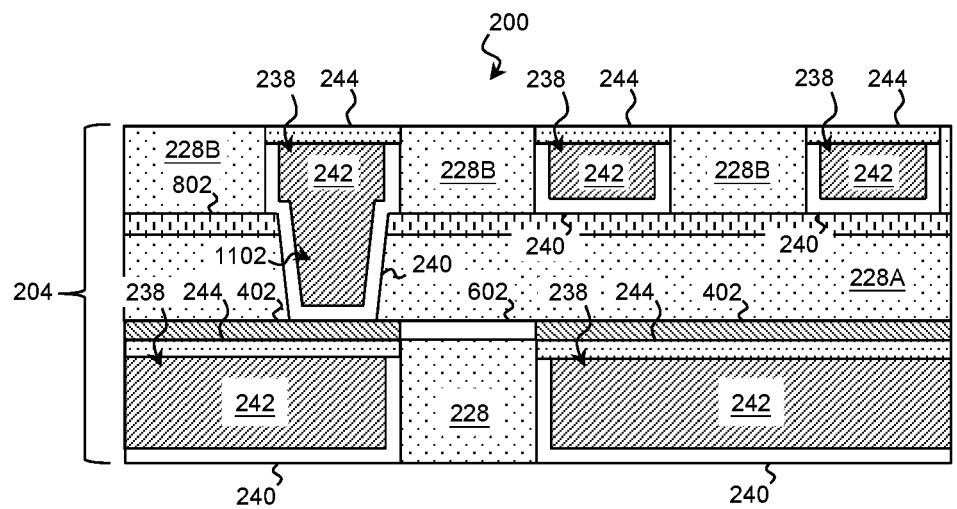

Referring to block 120 of FIG. 1B and to FIG. 11, conductive features such as conductive lines 238 and vias 1102 are formed in the recesses. In some examples, forming the conductive features begins by forming a liner 240 in the recesses 1002. Where the liner 240 is part of a via, the liner 240 physically and electrically couples to the underlying feature (e.g., a contact or a conductive line). The liner 240 may be substantially similar to the liner 240 above and may include any suitable conductive material including metals, metal nitrides, metal silicon nitrides, other suitable materials, and/or combinations thereof. In various examples, the liner 240 includes TiN and/or TaN. The liner 240 may be formed using any suitable process including ALD, PEALD, CVD, PECVD, HDP-CVD, and/or other suitable deposition processes and may be formed to any suitable thickness, and in various examples, the liner 240 has a thickness between about 1 nm and about 5 nm.

A fill material 242 is then formed in the recesses 1002 on the liner 240. The fill material 242 may be substantially similar to the fill material 242 above, and may include any suitable conductive material including metals, metal oxides, metal nitrides, other suitable materials, and/or combinations thereof. In various examples, the fill material 242 includes Cu, Co, or W. The fill material 242 may be formed using any suitable process including ALD, PEALD, CVD, PECVD, HDP-CVD, Physical Vapor Deposition (PVD), and/or other suitable deposition processes.

A Chemical Mechanical Planarization (CMP) process may be performed on the workpiece 200 to remove any material of the fill material 242 and/or the liner 240 that extends above the top of the line-level ILD layer 228B.

A line cap 244 may be formed on the conductive features by first recessing the liner 240 and the fill material 242. This may include etching the liner 240 and the fill material 242 using any suitable etching technique, such as wet etching, dry etching, RIE, and/or other etching methods, so that the top of the liner 240 and the fill material 242 is below the top of the line-level ILD layer 228B. The line cap 244 may then be deposited on the recessed liner 240 and fill material 242. The line cap 244 may be substantially similar to the line cap 244 above and may be deposited by any suitable process including ALD, PEALD, CVD, PECVD, HDP-CVD, and/or other suitable deposition processes. The line cap 244 may include any suitable conductive material including metals, metal oxides, metal nitrides, other suitable materials, and/or combinations thereof. The line cap 244 may be formed to any suitable thickness, and in various examples, the line cap 244 has a thickness between about 1 nm and about 5 nm. After depositing the line cap 244 material, a CMP process may be performed on the workpiece 200 to remove any material that extends above the top of the line-level ILD layer 228B. As can be seen in FIG. 11, the remaining liners 240, fill material 242, and line caps 244 form conductive lines 238 and vias 1102.

Figure 12:
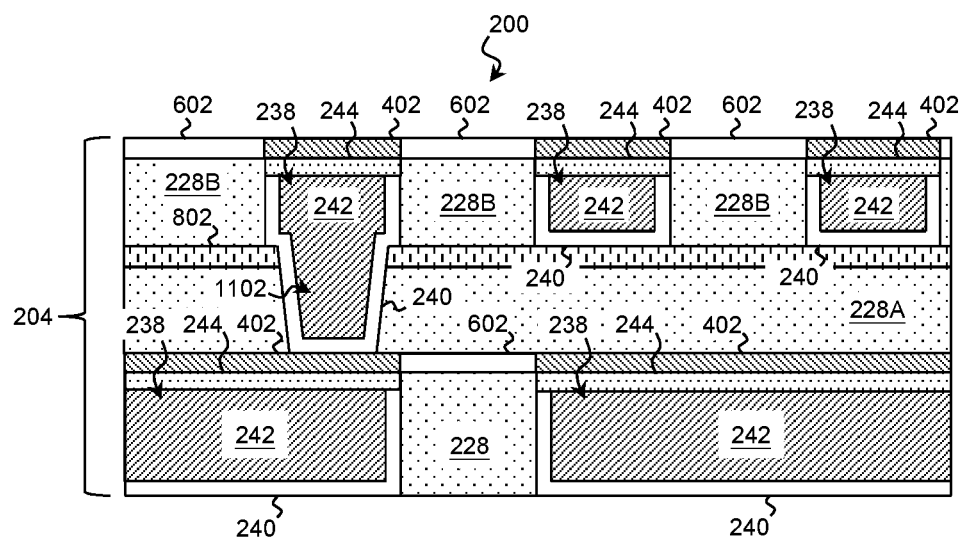

Referring to block 122 of FIG. 1B and to FIG. 12, another etch stop layer may be formed on the conductive lines 238 and the ILD layer 228B. Similar to the previous etch stop layer, this etch stop layer may include a conductive etch stop line cap 402 selectively deposited on the conductive lines 238 and a dielectric etch stop material 602 selectively deposited on the line-level ILD layer 228B. The forming of the etch stop layer may be performed substantially as described in blocks 104-110 of FIG. 1A. In some such examples, the etch stop line cap 402 includes an oxide of aluminum ($Al_xO_Y$) and/or an oxide of zirconium ($Zr_xO_Y$) and has a thickness between about 10 Å and about 50 Å, and the dielectric etch stop material 602 includes silicon oxide, silicon nitride, and/or a dielectric oxide of aluminum ($Al_xO_Y$) and has a thickness between about 10 Å and about 50 Å.

A CMP process may be performed after the dielectric etch stop material 602 is deposited. The CMP process may remove any portion of the dielectric etch stop material 602 deposited on the etch stop line cap 402 and planarize the workpiece 200 such that the tops of the dielectric etch stop material 602 and the etch stop line cap 402 are at substantially the same height.

As discussed above, capacitance between the conductive lines 238 and/or vias 1102 may increase signal propagation delay and may create a larger load for the circuit devices to drive. As a result, the size and power of the circuit devices may both increase. To decrease the capacitance, air gaps may be formed within the ILD layers to lower the dielectric constant. The processes that follow create air gaps within the line-level ILD layer 228B.

Figure 13:
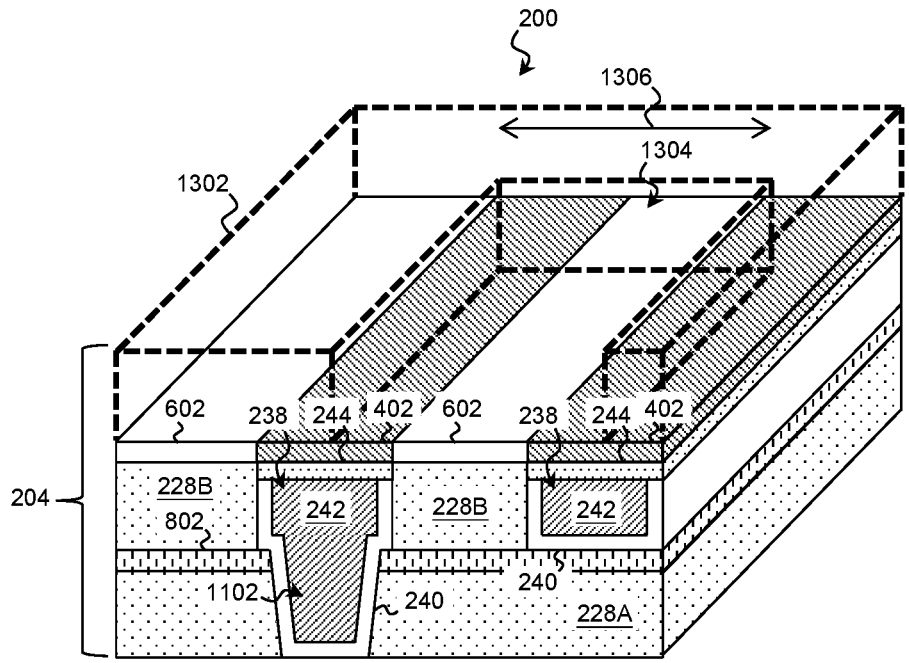
FIGS. 13-18 are perspective illustrations of the workpiece undergoing the method of fabrication according to various aspects of the present disclosure.

Referring to block 124 of FIG. 1B and to FIG. 13, a photoresist material 1302 is formed on the workpiece 200 and patterned to expose regions of the workpiece 200 where air gaps are to be formed. The photoresist material 1302 is represented by a transparent marker in FIG. 13 to avoid obscuring the underlying structures of the workpiece 200. As shown in FIG. 13, air gaps may be formed in some portions of the interconnect structure 204 without being formed in other portions. The location of the air gaps may depend on the arrangement of the conductive lines 238, and in some examples, air gaps are formed in regions where conductive lines 238 are arranged at a minimum spacing to reduce capacitance and omitted where the density of the conductive lines 238 is lower to avoid compromising the integrity of the workpiece 200.

The photoresist material 1302 that is used to define the air gaps may include any lithographically-sensitive material or composition. In some examples, the photoresist material 1302 is a tri-layer resist that includes a bottom layer, a middle layer, and a top layer, each with different or at least independent materials. For example, the bottom layer may include a $C_xH_yO_z$ material, the middle layer may include a $SiC_xH_yO_z$ polymer material, and the top layer may include a $C_xH_yO_z$ material with a photosensitive component that causes the top layer to undergo a property change when exposed to radiation. This property change can be used to selectively remove exposed (in the case of a positive tone resist) or unexposed (in the case of a negative tone resist) portions of the photoresist material 1302.

The photoresist material 1302 may be patterned using any suitable lithographic technique including photolithography and/or direct-write lithography. An exemplary photolithographic patterning process includes soft baking of the photoresist material 1302, mask aligning, exposure, post-exposure baking, developing the photoresist material 1302, rinsing, and drying (e.g., hard baking). An exemplary direct-write patterning process includes scanning the surface of the photoresist material 1302 with an e-beam or other energy source while varying the intensity of the energy source in order to vary the dosage received by various regions of the photoresist material 1302.

The developed photoresist material 1302 contains a recess 1304 that exposes the dielectric etch stop material 602 in regions of the workpiece 200 where air gaps are to be formed. The recess 1304 may also expose portions of the etch stop line cap 402. However, differences in etch selectivity allow the dielectric etch stop material 602 to be etched without etching the etch stop line cap 402. In this way, the etch stop line cap 402 allows wider recesses 1002 to be formed in the gate width direction (e.g., a width in direction 1306 just slightly less than the line-to-line pitch), which in turn may relax the overlay requirements.

Figure 14:
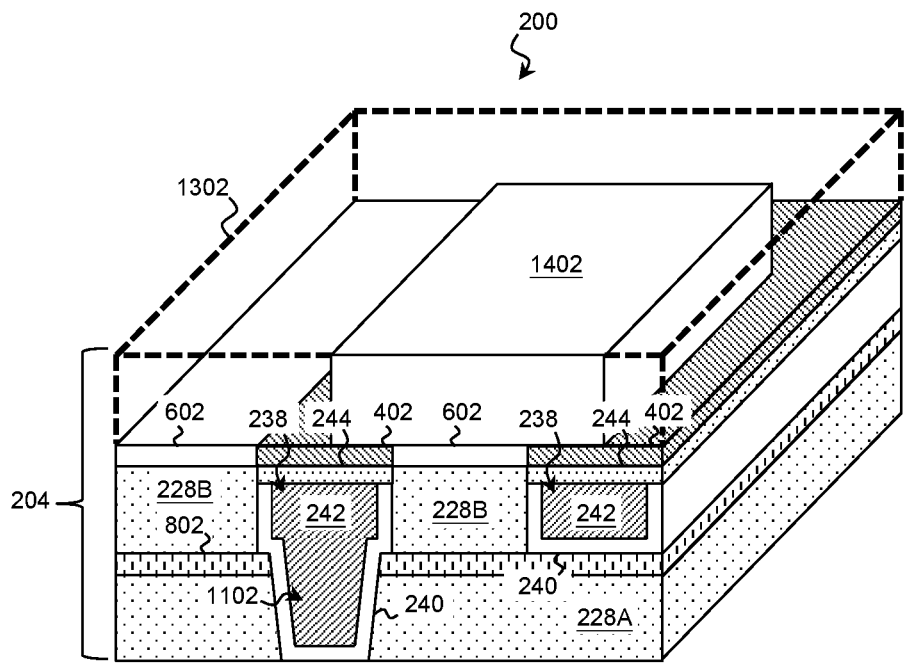

Referring to block 126 of FIG. 1B and to FIG. 14, a directed self-assembly (DSA) layer 1402 is formed within the recess 1304 of the photoresist material 1302. The DSA layer 1402 is used to form a mask for defining air gaps of the line-level ILD layer 228B. DSA materials take advantage of the tendency of some materials to align in regular, repeating patterns, such as spherical, cylindrical, lamellar (layered), and/or bicontinuous gyroid arrangements by undergoing microphase separation. The morphology of the microphase separated layer may depend on the constituent materials used, the relative amounts of the constituent materials, process variables including temperature, and other factors. In some embodiments, the different constituent materials of the DSA layer 1402 have different sensitivities to particular etchants. Individual constituent materials may be removed, and the remaining materials may be used as a mask to pattern underlying layers.

The DSA layer 1402 may include any suitable directed self-assembly material, such as anodic metal oxide, polystyrene and polymethyl methacrylate (PS-PMMA), and/or other suitable materials, and may be formed by any suitable process such as spin-on deposition, CVD, PECVD, HDP-CVD, ALD, PEALD, and/or other suitable processes. In some examples, a DSA layer 1402 including anodic metal oxide is formed to a thickness of between about 100 Å and about 300 Å using a spin-coating process. In some examples, a DSA layer 1402 including polystyrene and polymethyl methacrylate is formed to a thickness of between about 100 Å nm and about 300 Å using a spin-coating process.

Figure 15:
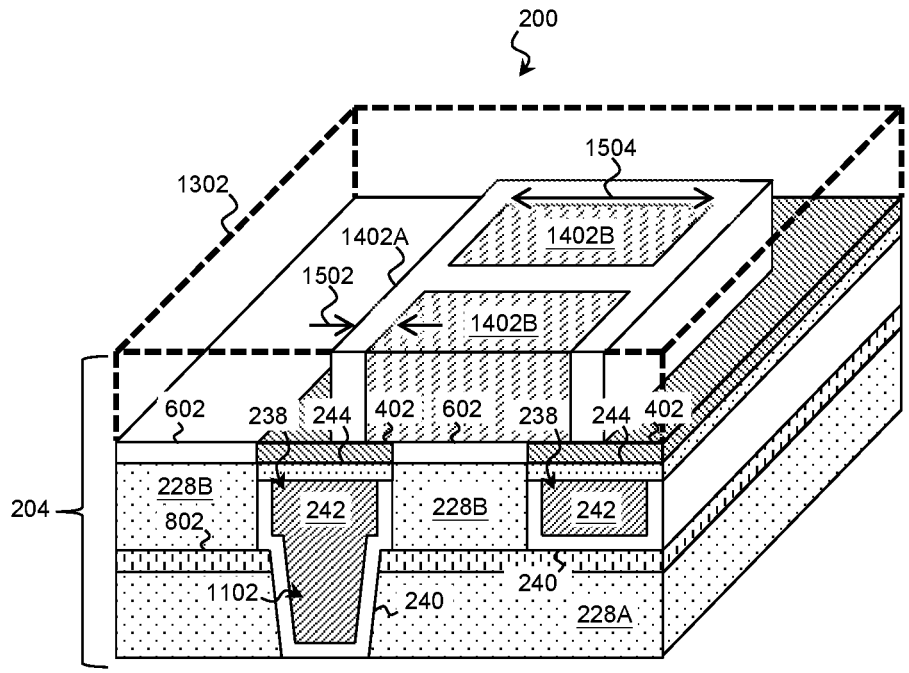

Referring to block 128 of FIG. 1B and to FIG. 15, one or more processes may be performed on the DSA layer 1402 to induce microphase separation. The particular processes may depend on the constituent polymers of the DSA layer 1402 and may include heating, cooling, introduction of a solvent, application of a magnetic field, and/or other techniques. In an exemplary embodiment, a DSA layer 1402 containing polystyrene and PMMA is annealed at a temperature of between about 100° C. and about 400° C. in order to induce microphase separation. This causes the constituent polymer blocks to segregate and align. In examples of FIG. 15, the microphase separation forms blocks of a first constituent polymer 1402A and blocks of a second constituent polymer 1402B. In various embodiments, polymer blocks 1402A have a width 1502 of between about 10 nm and about 30 nm and polymer blocks 1402B have a width 1504 of between about 10 nm and about 30 nm. It is understood that the width 1502 of the polymer blocks 1402A and the width 1504 of the polymer blocks 1402B are not necessarily equivalent and may vary independently. Block widths may be controlled during the deposition of the DSA layer 1402 of block 126 and may depend on deposition parameters such as the selected constituent polymers, the relative concentration of constituent polymers, the use of a solvent, and/or other deposition parameters and techniques known to one of skill in the art. In particular, block sizes may depend on the molecular weights of the constituent polymers and/or the relative molecular weights of the constituent polymers. Block sizes may also be controlled during the microphase separation of block 128 via processing parameters such as temperature, use of a solvent, application of a magnetic field, the ambient gas atmosphere, and/or other suitable parameters.

Figure 16:
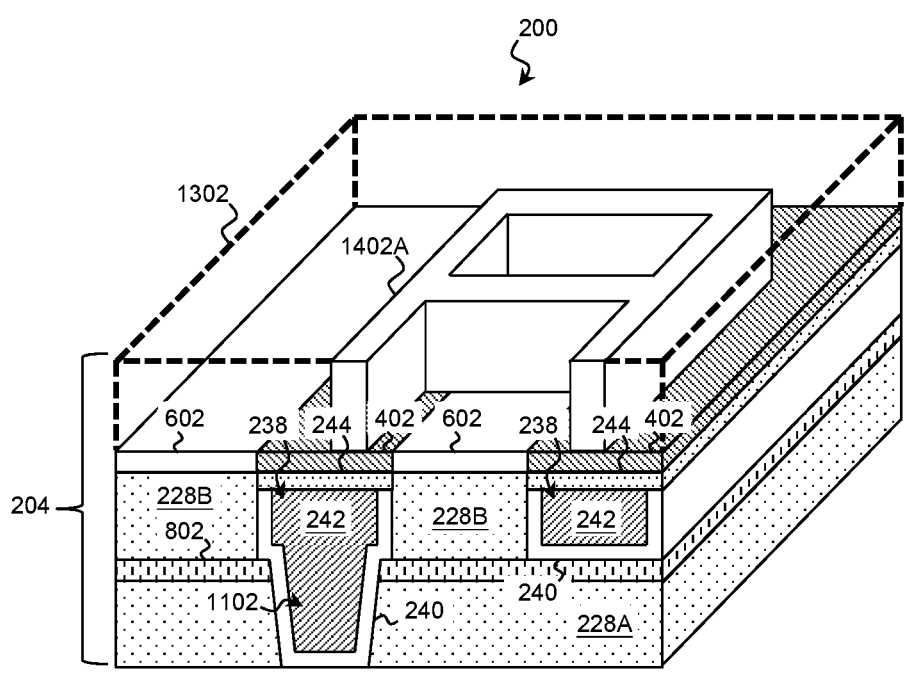

Referring to block 130 of FIG. 1B and to FIG. 16, blocks of a constituent polymer (e.g., the second constituent polymer 1402B) are selectively removed. The selective removal process does not remove blocks of the first constituent polymer 1402A. The removal process may include any suitable etching process such as dry etching, wet etching, RIE ashing, and/or other etching methods. In some embodiments, the removal process includes the use of a solvent such as acetone, benzene, chloroform, methylene chloride, and/or other suitable solvent. In an exemplary embodiment, PMMA is more sensitive to $O_2$ plasma etching than polystyrene. Accordingly, $O_2$ plasma etching is used with a PMMA/polystyrene DSA layer 1402 to remove the PMMA and leave the polystyrene behind as a mask.

Figure 17:
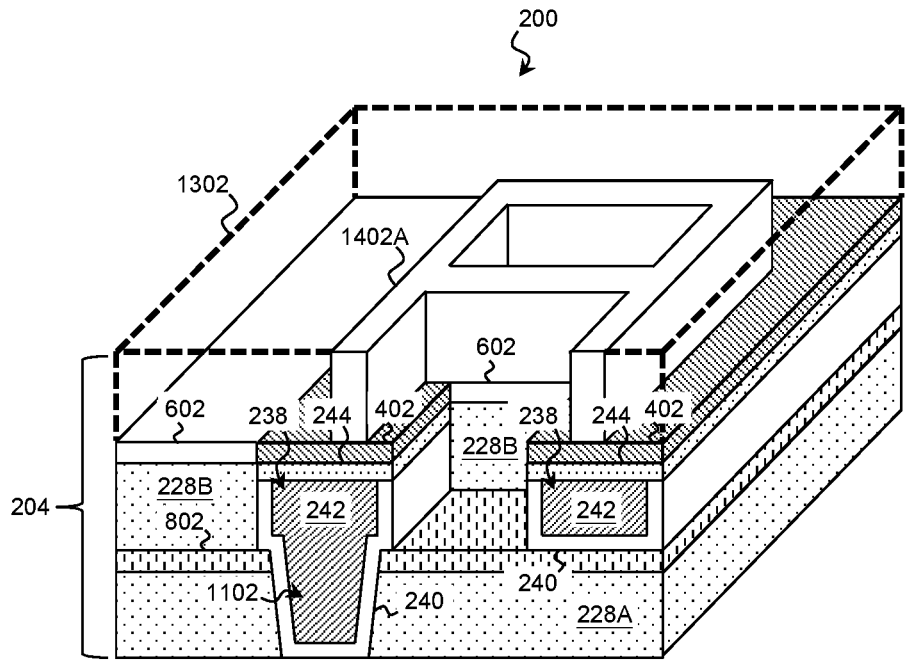

Referring to block 132 of FIG. 1B and to FIG. 17, the exposed portions of the dielectric etch stop material 602 and the line-level ILD layer 228B are selectively etched to create air gaps in the line-level ILD layer 228B. The etching may include any suitable etching technique such as wet etching, dry etching, RIE, and/or other etching methods. In some examples, the etching is followed by a cleaning process such as wet cleaning with a dilute hydrofluoric acid solution. The etching technique and etchant(s) may be selected to etch the dielectric etch stop material 602 and the line-level ILD layer 228B without significant etching of the surrounding structures, such as the etch stop line cap 402 and the conductive lines 238.

In particular, the etching of block 132 may be configured to stop etching when the MESL 802 is exposed so that the MESL 802 forms the bottom of the air gaps and air gaps are not formed in the via-level ILD layer 228A. As the conductive lines 238 may be the largest contributor to interconnect capacitance, forming air gaps between the conductive lines 238 (e.g., in the line-level ILD layer 228B) may provide significantly more capacitance reduction than forming air gaps elsewhere (e.g., in the via-level ILD layer 228A). Furthermore, by not forming air gaps in the via-level ILD layer 228A, the technique may avoid compromising the vias and thereby producing via-bridging, time dependent dielectric breakdown, and/or other via defects.

Figure 18:
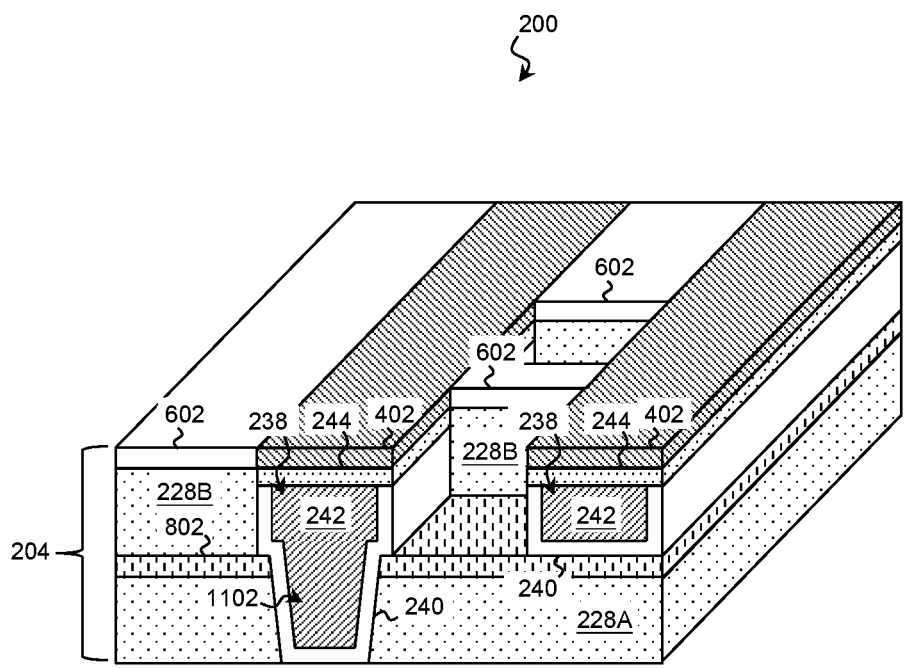
Figure 19:
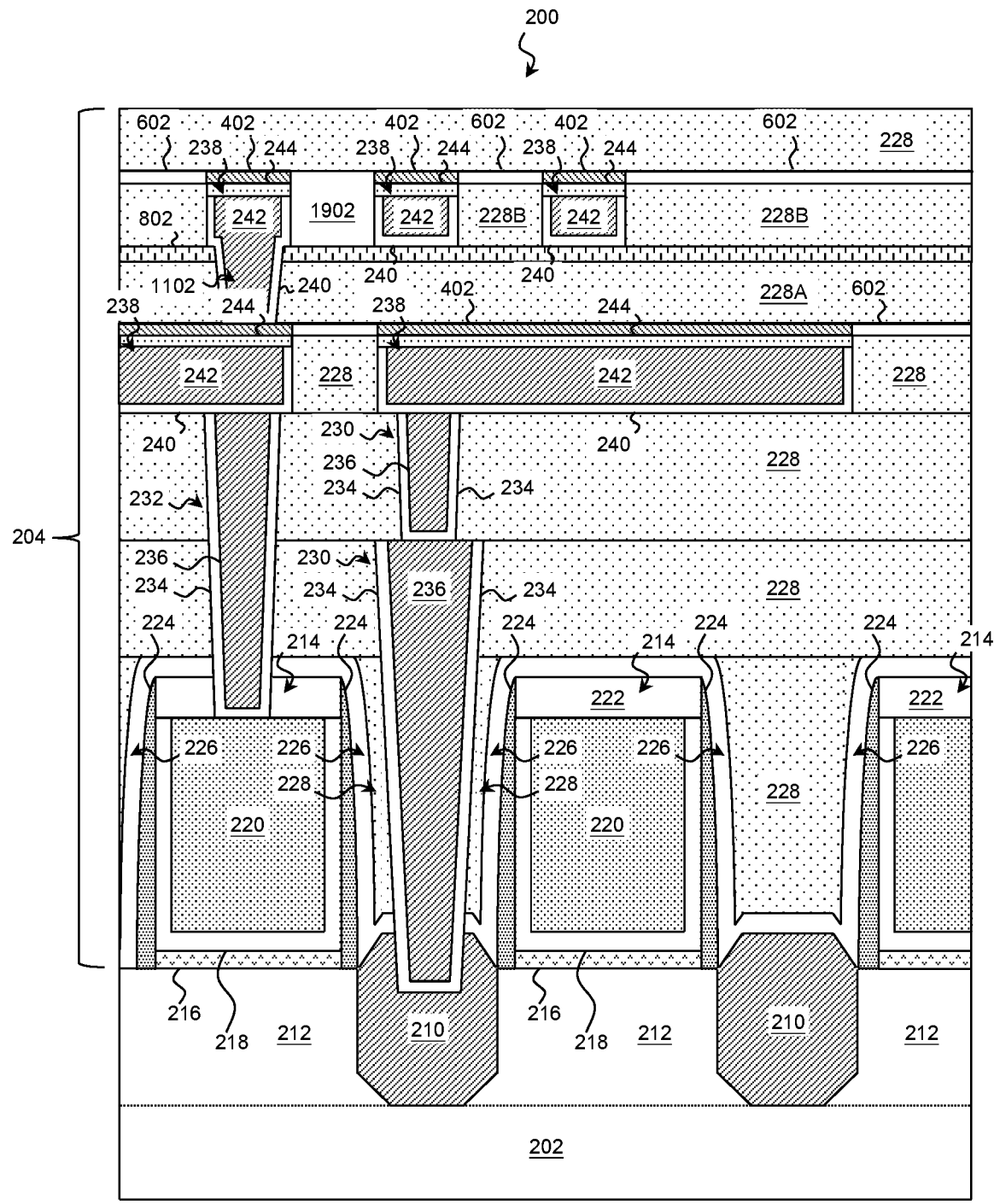
FIG. 19 is a cross-sectional illustration of the workpiece undergoing the method of fabrication according to various aspects of the present disclosure.

Referring to block 134 of FIG. 1B and to FIGS. 18 and 19, the photoresist material 1302 and the remaining portions of the DSA layer 1402 may be removed. This may be performed by etching (e.g., wet etching, dry etching, RIE), CMP, and/or other suitable techniques.

Referring to block 136 of FIG. 1B, the method 100 determines whether there are additional layers of the interconnect structure 204 to form. If so, the method 100 may return to block 112 and blocks 112-136 are repeated to form subsequent layers. In particular, when depositing a material on the line-level ILD layer 228B and the etch stop layer when air gaps are present (e.g., when depositing the via-level ILD layer 228A in block 112), the deposition technique may be configured to have relatively low gap-filling ability to avoid depositing material in the air gaps 1902 as shown in FIG. 19. Suitable non-conformal deposition processes include CVD, PECVD, HDP-CVD, and spin-on coating.

When it is determined in block 136 of FIG. 1B that all layers of the interconnect have been formed, the method 100 proceeds to block 138, where the workpiece 200 is provided for further fabrication. In various examples, this includes metallization, dicing, packaging, and other fabrication processes.

Figure 20:
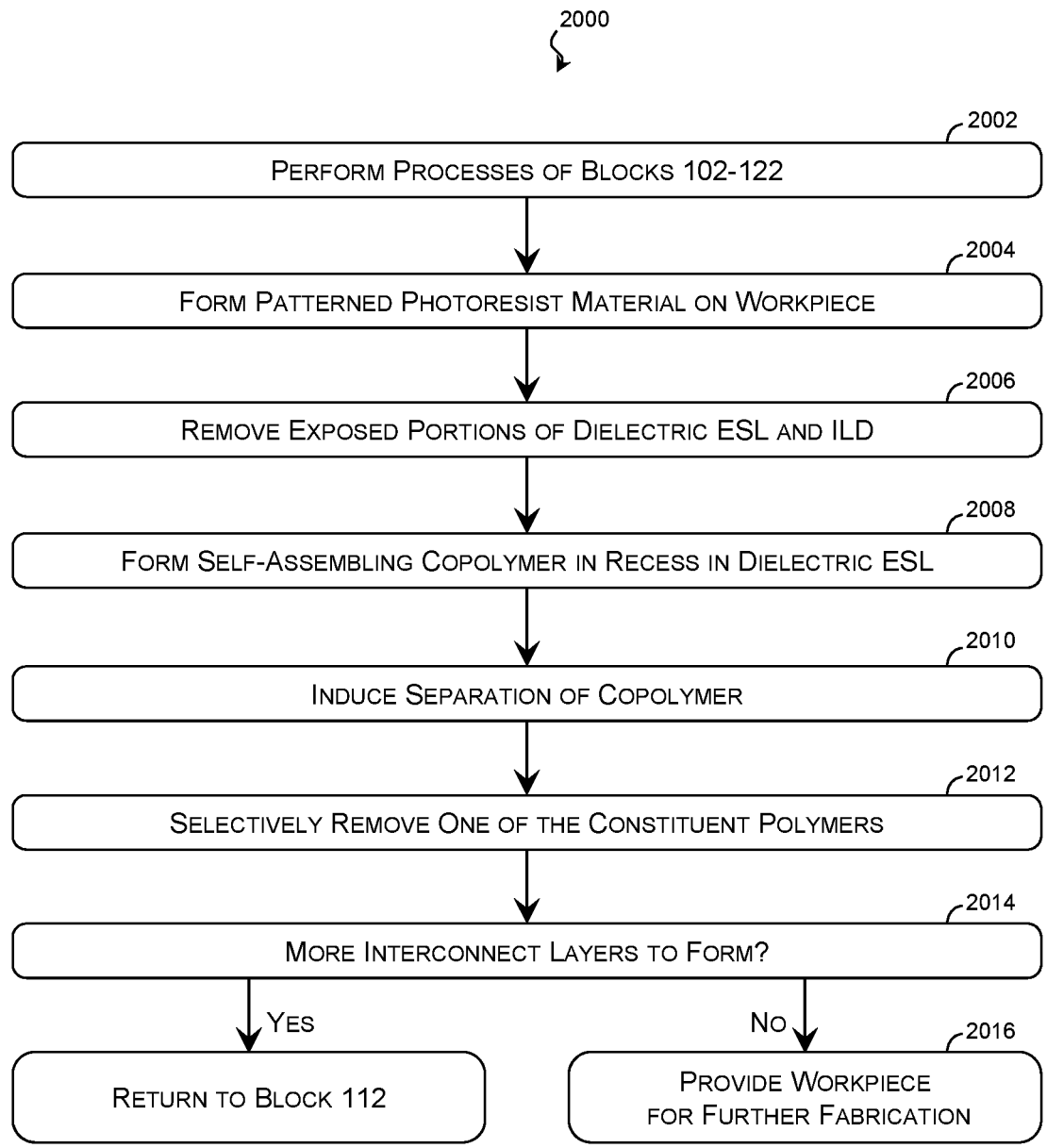
FIG. 20 is a flow diagram of a method of fabricating a workpiece with a directed self-assembly layer defining an air gap according to various aspects of the present disclosure.

Whereas the above examples form the DSA layer 1402 on top of the line-level ILD layer 228B, further examples form a DSA layer within a recess in the line-level ILD layer 228B and thus between the conductive lines 238. Some portion of the DSA layer may remain between the conductive lines 238 to define the air gap. FIG. 20 is a flow diagram of a method 2000 of fabricating a workpiece 2100 with a DSA layer defining an air gap according to various aspects of the present disclosure. Additional steps can be provided before, during, and after the method 2000, and some of the steps described can be replaced or eliminated for other embodiments of the method 2000. FIGS. 21-25 are perspective illustrations of the workpiece 2100 undergoing the method 2000 of fabrication according to various aspects of the present disclosure. FIG. 26 is a cross-sectional illustration of the workpiece 2100 undergoing the method 2000 of fabrication according to various aspects of the present disclosure.

Figure 21:
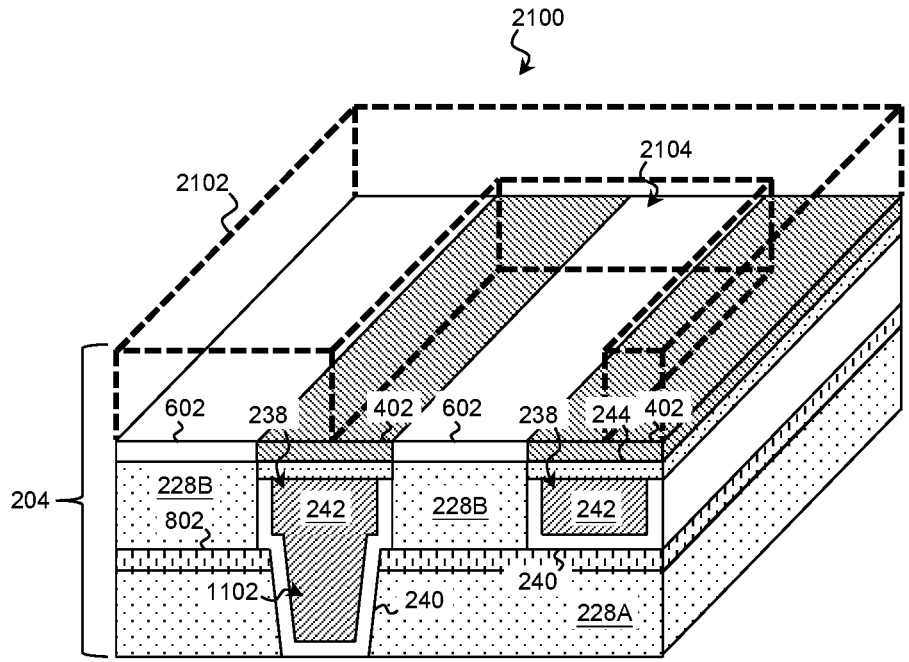
FIGS. 21-25 are perspective illustrations of the workpiece undergoing the method of fabrication according to various aspects of the present disclosure.

Referring to block 2002 of FIG. 20 and to FIG. 21, the processes of blocks 102-122 of FIGS. 1A and 1B are performed on a workpiece 2100 substantially as described above. Workpiece 2100 is substantially similar to workpiece 200, except where otherwise noted. For example, workpiece 2100 includes an interconnect 204 with conductive lines 238 and vias 1102 disposed in dielectric layers (e.g., via-level ILD layer 228A, line-level ILD layer 228B, MESL 802, etc.). Workpiece 2100 may also include an etch stop layer that, in turn, includes an etch stop line cap 402 and a dielectric etch stop material 602.

Referring to block 2004 of FIG. 20 and referring still to FIG. 21, a photoresist material 2102 is formed on the workpiece 2100 and patterned to expose regions of the workpiece 2100 where air gaps are to be formed. This may be performed substantially as described in block 124 of FIG. 1B, and the developed photoresist material 2102 contains a recess 2104 that exposes the dielectric etch stop material 602 in regions of the workpiece 2100 where air gaps are to be formed.

Figure 22:
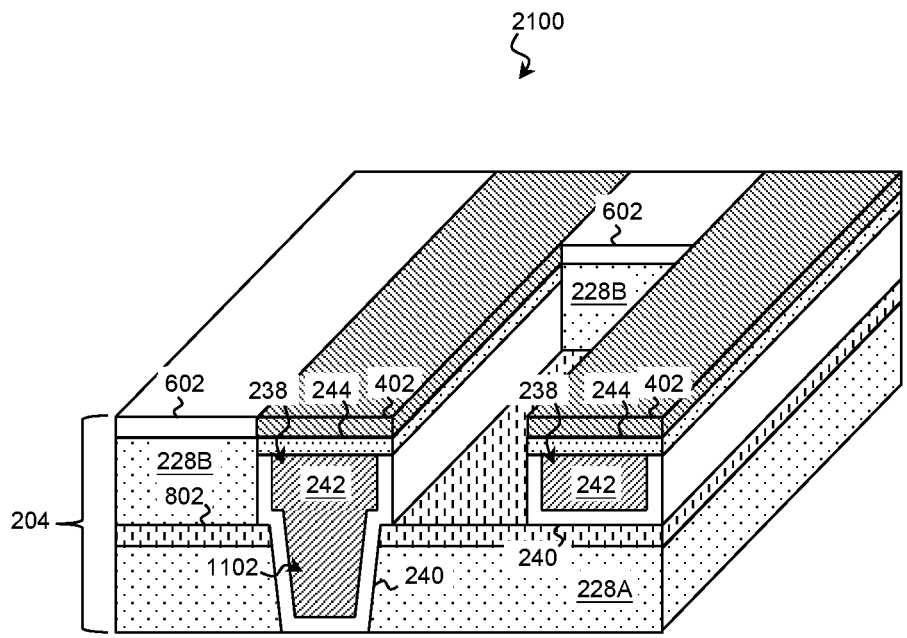

Referring to block 2006 of FIG. 20 and to FIG. 22, the exposed portions of the dielectric etch stop material 602 and the line-level ILD layer 228B are selectively etched to create air gaps in the line-level ILD layer 228B. This may be performed substantially as described in block 132 of FIG. 1B, and the etching may include any suitable etching technique such as wet etching, dry etching, RIE, and/or other etching methods. In some examples, the etching is followed by a cleaning process such as wet cleaning with a dilute hydrofluoric acid solution. The etching of block 2006 may be configured to stop etching when the MESL 802 is exposed so that air gaps are not formed in the via-level ILD layer 228A. After the etching process, the photoresist material 2102 may be removed.

Figure 23:
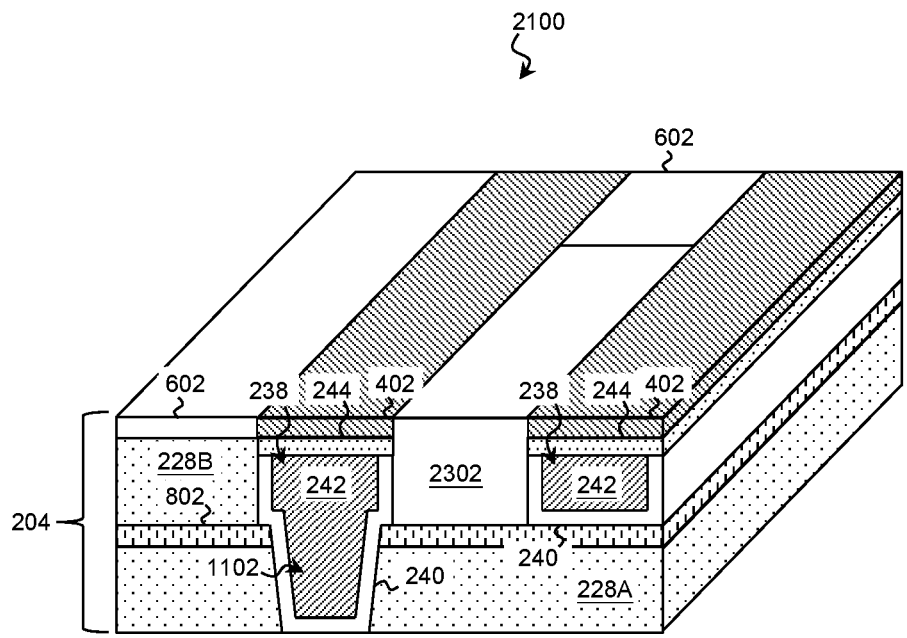

Referring to block 2008 of FIG. 20 and to FIG. 23, a DSA layer 2302 is formed on the workpiece 2100 between the conductive lines 238. This may be performed substantially as described in block 126 of FIG. 1B, and the DSA layer 2302 may include a directed self-assembly material, such as anodic metal oxide, PS-PMMA, and/or other suitable materials. The DSA layer 2302 may be formed by any suitable process such as spin-on deposition, CVD, PECVD, HDP-CVD, ALD, PEALD, and/or other suitable processes, and may be deposited to any suitable thickness.

Figure 24:
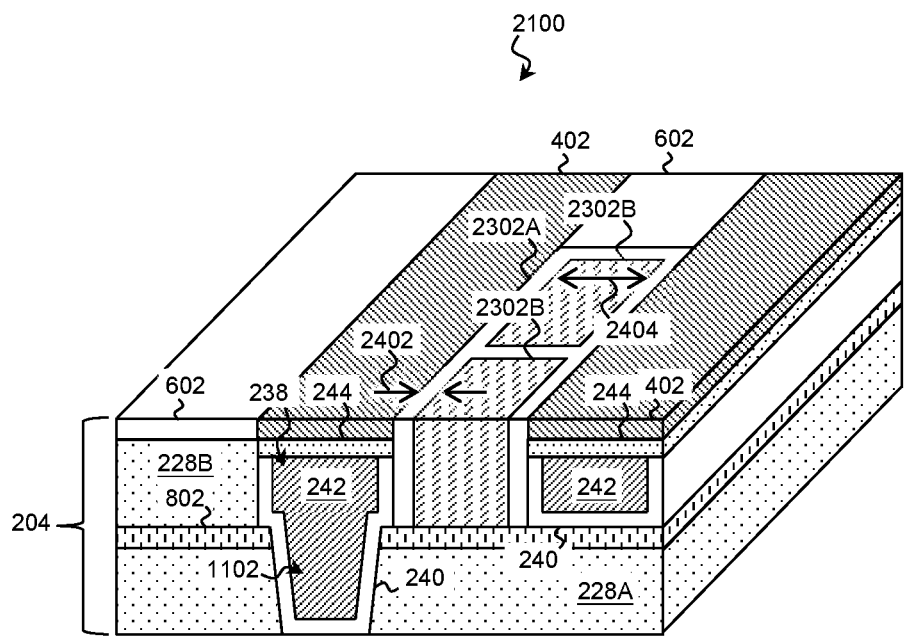

Referring to block 2010 of FIG. 20 and to FIG. 24, one or more processes may be performed on the DSA layer 2302 to induce microphase separation. This may be performed substantially as described in block 128 of FIG. 1B, and the process may include heating, cooling, introduction of a solvent, application of a magnetic field, and/or other techniques. In examples of FIG. 24, the microphase separation forms blocks of a first constituent polymer 2302A and blocks of a second constituent polymer 2302B. In various embodiments, polymer blocks 2302A have a width 2402 of between about 10 nm and about 30 nm and polymer blocks 2302B have a width 2404 of between about 10 nm and about 30 nm.

Figure 25:
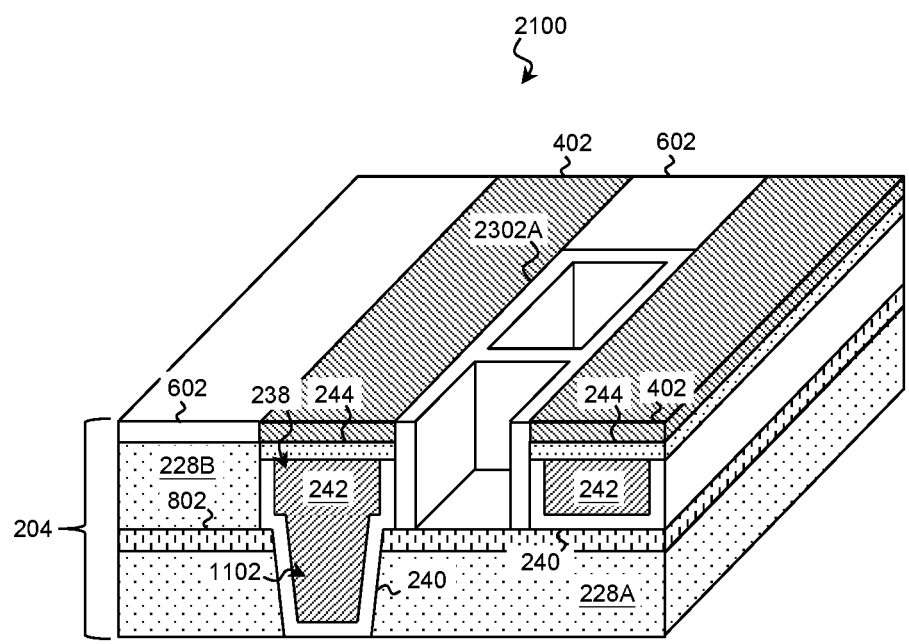
Figure 26:
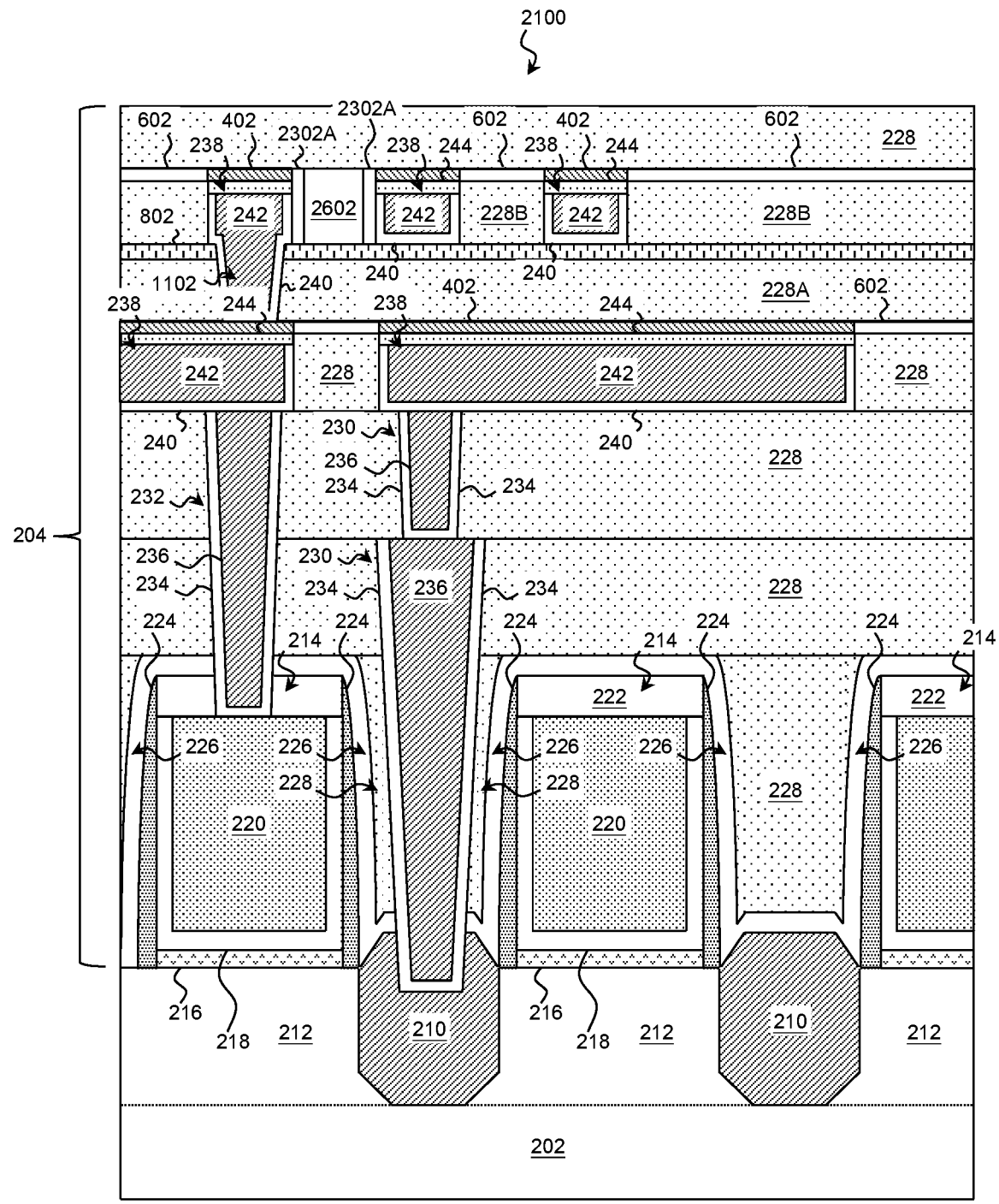
FIG. 26 is a cross-sectional illustration of the workpiece undergoing the method of fabrication according to various aspects of the present disclosure.

Referring to block 2012 of FIG. 20 and to FIGS. 25 and 26, blocks of a constituent polymer (e.g., the second constituent polymer 2302B) are selectively removed. This may be performed substantially as described in block 130 of FIG. 1B, and the selective removal process does not remove blocks of the first constituent polymer 2302A. The removal of the second constituent polymer 2302B leaves air gaps 2602 in the interconnect 204 defined by the remaining constituent polymer 2302A.

Referring to block 2014 of FIG. 20, the method 2000 determines whether there are additional layers of the interconnect structure 204 to form. If so, the method 2000 may return to block 112 (contained in block 2002 of FIG. 20) and the processes of blocks 112-136 of FIGS. 1A and 1B are repeated to form subsequent layers. When depositing a material on the line-level ILD layer 228B and the etch stop layer when air gaps are present (e.g., when depositing the via-level ILD layer 228A in block 112), the deposition technique may be configured to have relatively low gap-filling ability to avoid depositing material in the air gaps 2602 as shown in FIG. 26. Suitable non-conformal deposition processes include CVD, PECVD, HDP-CVD, and spin-on coating.

When it is determined in block 2014 of FIG. 20 that all layers of the interconnect have been formed, the method 2000 proceeds to block 2016, where the workpiece 2100 is provided for further fabrication. In various examples, this includes metallization, dicing, packaging, and other fabrication processes.

Thus, the present disclosure provides examples of an integrated circuit with an interconnect structure and a method for forming the integrated circuit. In some embodiments, a method of forming an integrated circuit device includes receiving a workpiece having an interconnect structure that includes a first conductive feature, a second conductive feature disposed beside the first conductive feature, and an inter-level dielectric (ILD) disposed between the first conductive feature and the second conductive feature. A conductive material of an etch stop layer is selectively deposited on the first conductive feature and on the second conductive feature without depositing the conductive material on the ILD, and the ILD is removed to form a gap between the first conductive feature and the second conductive feature. In some such embodiments, the depositing of the conductive material includes performing a treatment on the first conductive feature and the second conductive feature to promote bonding between the conductive material and each of the first conductive feature and the second conductive feature. In some such embodiments, the treatment changes a hydrophilicity of a top surface the first conductive feature based on a hydrophilicity of the conductive material. In some such embodiments, a dielectric material of the etch stop layer is deposited on the ILD, and the removing of the ILD removes the dielectric material of the etch stop layer. In some such embodiments, the depositing of the dielectric material of the etch stop layer is configured to avoid depositing the dielectric material on the conductive material of the etch stop layer. In some such embodiments, the depositing of the dielectric material includes performing a treatment on the ILD that changes a hydrophilicity of a top surface the ILD based on a hydrophilicity of the dielectric material. In some such embodiments, the ILD is a line-level ILD, and interconnect structure further includes a via-level ILD disposed underneath the line-level ILD and disposed below a bottommost surface of the gap. The first conductive feature includes a via portion that extends through the via-level ILD. In some such embodiments, the interconnect structure further includes a mid-level etch stop layer disposed between the via-level ILD and the line-level ILD, and the removing of the line-level ILD is configured such that the mid-level etch stop layer defines the bottommost surface of the gap. In some such embodiments, the removing of the ILD includes forming a photoresist material on the workpiece and patterning the photoresist material to define a recess over the ILD. A directed self-assembly material is formed within the recess and induced to separate into a first region of a first material and a second region of a second material. The second material is removed, and a portion of the ILD underneath the removed second material is etched. In some such embodiments, the removing of the second material exposes a portion of the conductive material of the etch stop layer, and the etching of the portion of the ILD is configured to avoid etching the exposed portion of the conductive material. In some such embodiments, the ILD is a first ILD, and a second ILD is formed on the first conductive feature, on the second conductive feature, and on the gap. The forming of the second ILD is configured to avoid filling the gap.

In further embodiments, a method includes receiving a substrate and an interconnect structure disposed on the substrate. The interconnect structure includes an interconnect dielectric layer, and a plurality of conductive features disposed in the interconnect dielectric layer. An etch stop layer is formed on the interconnect structure, which includes: selectively forming an etch stop conductor on the plurality of conductive features, and selectively forming an etch stop dielectric on the interconnect dielectric layer. A portion of the interconnect dielectric layer is removed to define a gap between the plurality of conductive features. In some such embodiments, the forming of the etch stop layer further includes performing a treatment on the plurality of conductive features prior to the forming of the etch stop conductor to promote bonding between the etch stop conductor and the conductive features. In some such embodiments, the treatment changes a hydrophilicity of the plurality of conductive features based on a hydrophilicity of the etch stop conductor. In some such embodiments, the etch stop conductor includes a material from a group consisting of an oxide of aluminum and an oxide of zirconium. In some such embodiments, the removing of the portion of the interconnect dielectric layer includes forming a directed self-assembly material on the etch stop layer, and inducing the directed self-assembly material to dissociate into a first material and a second material overlying the portion of the interconnect dielectric layer. The second material is removed, and a portion of the etch stop dielectric and the portion of the interconnect dielectric layer exposed by the removing of the second material are etched.

In yet further embodiments, a device includes a substrate, an inter-level dielectric layer disposed on the substrate, a plurality of conductive features disposed within the inter-level dielectric layer, an etch stop layer disposed on the inter-level dielectric layer and on the plurality of conductive features, and a gap extending between two of the plurality of conductive features. In some such embodiments, the etch stop layer includes a conductive etch stop material disposed on the plurality of conductive features and a dielectric etch stop material disposed on the inter-level dielectric layer. In some such embodiments, a top surface of the conductive etch stop material and a top surface of the dielectric etch stop material are at substantially the same level. In some such embodiments, the etch stop layer is a first etch stop layer, and the device further includes a second etch stop layer disposed between the substrate and the inter-level dielectric layer. The second etch stop layer defines a bottom of the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device comprising:
  receiving a workpiece having an interconnect structure that includes:
    a first conductive feature;
    a second conductive feature disposed beside the first conductive feature; and
    an inter-level dielectric (ILD) disposed between the first conductive feature and the second conductive feature;
  selectively depositing a metal-containing material of an etch stop layer on the first conductive feature and on the second conductive feature without depositing the metal-containing material on the ILD;
  depositing a dielectric material of the etch stop layer over the ILD without depositing the dielectric material over the metal-containing material of the etch stop layer; and
  removing at least a portion of the dielectric material of the etch stop layer and at least a portion of the ILD to form a gap between the first conductive feature and the second conductive feature.

2. The method of claim 1, wherein the depositing of the metal-containing material includes performing a treatment on the first conductive feature and the second conductive feature to promote bonding between the metal-containing material and each of the first conductive feature and the second conductive feature.

3. The method of claim 2, wherein the treatment changes a hydrophilicity of a top surface the first conductive feature based on a hydrophilicity of the metal-containing material.

4. The method of claim 1, wherein the depositing of the dielectric material includes performing a treatment on the ILD that changes a hydrophilicity of a top surface the ILD based on a hydrophilicity of the dielectric material.

5. The method of claim 1, wherein:
  the ILD is a line-level ILD;
  the interconnect structure further includes a via-level ILD disposed underneath the line- level ILD and disposed below a bottommost surface of the gap; and
  the first conductive feature includes a via portion that extends through the via-level ILD.

6. The method of claim 5, wherein:
  the interconnect structure further includes a mid-level etch stop layer disposed between the via-level ILD and the line-level ILD; and
  the removing of the line-level ILD is configured such that the mid-level etch stop layer defines the bottommost surface of the gap.

7. The method of claim 1, wherein the removing of the ILD includes:
  forming a photoresist material on the workpiece;
  patterning the photoresist material to define a recess over the ILD;
  forming a directed self-assembly material within the recess;
  inducing the directed self-assembly material to separate into a first region of a first material and a second region of a second material;
  removing the second material; and
  etching a portion of the ILD underneath the removed second material.

8. The method of claim 7, wherein the removing of the second material exposes a portion of the metal-containing material of the etch stop layer, and wherein the etching of the portion of the ILD is configured to avoid etching the exposed portion of the metal-containing material.

9. The method of claim 1, wherein the ILD is a first ILD, the method further comprising forming a second ILD on the first conductive feature, on the second conductive feature, and on the gap, wherein the forming of the second ILD is configured to avoid filling the gap.

10. A method comprising:
  receiving a workpiece comprising a substrate and an interconnect structure disposed on the substrate, wherein the interconnect structure includes:
    an interconnect dielectric layer; and
    a plurality of conductive features disposed in the interconnect dielectric layer;
  after the receiving of the workpiece, forming an etch stop layer on the interconnect structure, wherein the forming of the etch stop layer includes:
    selectively forming a metal oxide etch stop feature on the plurality of conductive features; and
    selectively forming an etch stop dielectric on the interconnect dielectric layer without forming the etch stop dielectric directly over the plurality of conductive features;
  after the forming of the etch stop layer, forming a gap between the plurality of conductive features.

11. The method of claim 10, wherein the forming of the etch stop layer further includes performing a treatment on the plurality of conductive features prior to the forming of the metal oxide etch stop feature to promote bonding between the metal oxide etch stop feature and the conductive features.

12. The method of claim 10, wherein the forming of the gap comprises:
   removing a portion of the interconnect dielectric layer between the plurality of conductive features to form an opening;
   depositing a directed self-assembly material in the opening between the plurality of conductive features;
   inducing the directed self-assembly material to dissociate into a first material and a second material; and
   selectively removing the second material to form the gap.

13. The method of claim 12, wherein, after the selectively removing of the second material, the gap is spaced apart from the plurality of conductive features by the first material.

14. The method of claim 10, wherein the forming of the gap includes:
   forming a directed self-assembly material on the etch stop layer;
   inducing the directed self-assembly material to dissociate into a first material and a second material overlying the interconnect dielectric layer;
   removing the second material; and
   etching a portion of the etch stop dielectric and a portion of the interconnect dielectric layer exposed by the removing of the second material.

15. A method, comprising:
   receiving a workpiece that includes:
      a first conductive line;
      a second conductive line disposed beside the first conductive line; and
      an inter-level dielectric (ILD) disposed between the first conductive line and the second conductive line;
   selectively depositing an etch stop line cap layer on the first conductive line and the second conductive line;
   selectively depositing a dielectric etch stop layer directly on an entire surface of the ILD disposed between the first conductive line and the second conductive line;
   after the selectively depositing of the dielectric etch stop layer, removing a portion of the ILD to form an air gap between the first conductive line and the second conductive line.

16. The method of claim 15, wherein the portion of the ILD is a first portion of the ILD, wherein the removing comprises:
   forming a photoresist material on the workpiece;
   patterning the photoresist material to define a recess over a second portion of the ILD, a portion of the first conductive line and a portion of the second conductive line;
   forming a directed self-assembly material within the recess;
   inducing the directed self-assembly material to separate into a first region of a first material and a second region of a second material;
   removing the second material; and
   etching the first portion of the ILD underneath the removed second material.

17. The method of claim 15, further comprising:
   before the selectively depositing of the etch stop line cap layer, recessing the first conductive line and the second conductive line;
   depositing a line cap layer over the workpiece; and
   planarizing the workpiece until the ILD is exposed.

18. The method of claim 17, wherein the etch stop line cap layer comprises aluminum oxide or zirconium oxide, and wherein the dielectric etch stop layer comprises silicon oxide or silicon nitride.

19. The method of claim 7, wherein the directed self-assembly material comprises polystyrene and polymethyl methacrylate (PMMA), and the inducing of the directed self-assembly material comprises annealing the directed self-assembly material at a temperature of between about 100° C. and about 400° C.

20. The method of claim 7, wherein at least a portion of the first region of the directed self-assembly material directly contacts the dielectric material of the etch stop layer.

* * * * *